(12) United States Patent
Kishii et al.

(10) Patent No.: US 7,701,016 B2
(45) Date of Patent: Apr. 20, 2010

(54) SEMICONDUCTOR DEVICE HAVING DEVICE CHARACTERISTICS IMPROVED BY STRAINING SURFACE OF ACTIVE REGION AND ITS MANUFACTURE METHOD

(75) Inventors: Sadahiro Kishii, Kawasaki (JP); Hirofumi Watatani, Kawasaki (JP); Masanori Terahara, Kawasaki (JP); Ryo Tanabe, Kawasaki (JP); Kaina Suzuki, Kawasaki (JP); Shigeo Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 351 days.

(21) Appl. No.: 11/541,782

(22) Filed: Oct. 3, 2006

(65) Prior Publication Data
US 2007/0228488 A1 Oct. 4, 2007

(30) Foreign Application Priority Data
Mar. 30, 2006 (JP) .............................. 2006-094704

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/374; 257/506; 257/510; 438/197; 438/424

(58) Field of Classification Search .................. 257/374, 257/506, 510; 438/197, 424, 435
See application file for complete search history.

(56) References Cited

U.S. PATENT DOCUMENTS

| | | | | |
|---|---|---|---|---|
| 5,250,836 A | * | 10/1993 | Miura et al. | 257/506 |
| 5,969,393 A | * | 10/1999 | Noguchi | 257/396 |
| 7,029,989 B2 | * | 4/2006 | Kim et al. | 438/429 |
| 7,214,982 B2 | * | 5/2007 | Kumura et al. | 257/301 |
| 7,355,262 B2 | * | 4/2008 | Ko et al. | 257/506 |
| 2005/0127474 A1 | * | 6/2005 | Matsuda | 257/510 |
| 2006/0030110 A1 | * | 2/2006 | Kumura et al. | 438/296 |
| 2006/0220142 A1 | * | 10/2006 | Tamura | 257/374 |
| 2007/0020879 A1 | * | 1/2007 | Baek et al. | 438/424 |

FOREIGN PATENT DOCUMENTS

JP 2004-311954 A 11/2004

OTHER PUBLICATIONS

Y. Kumagai et al.; "Evaluation of Change in Drain Current Due to Strain in 0.13-Micrometer-node MOSFETs"; Extended Abstract of the 2002 International Conference on SSDM, pp. 14-15.

* cited by examiner

*Primary Examiner*—Phuc T Dang
(74) *Attorney, Agent, or Firm*—Fujitsu Patent Center

(57) ABSTRACT

A trench is formed in the surface layer of a semiconductor substrate, surrounding an active region. A lower insulating film made of insulating material fills a lower region of the trench. An upper insulating film fills a region of the trench above the lower insulating film. The upper insulating film has therein a stress generating tensile strain in a surface layer of the active region.

7 Claims, 18 Drawing Sheets

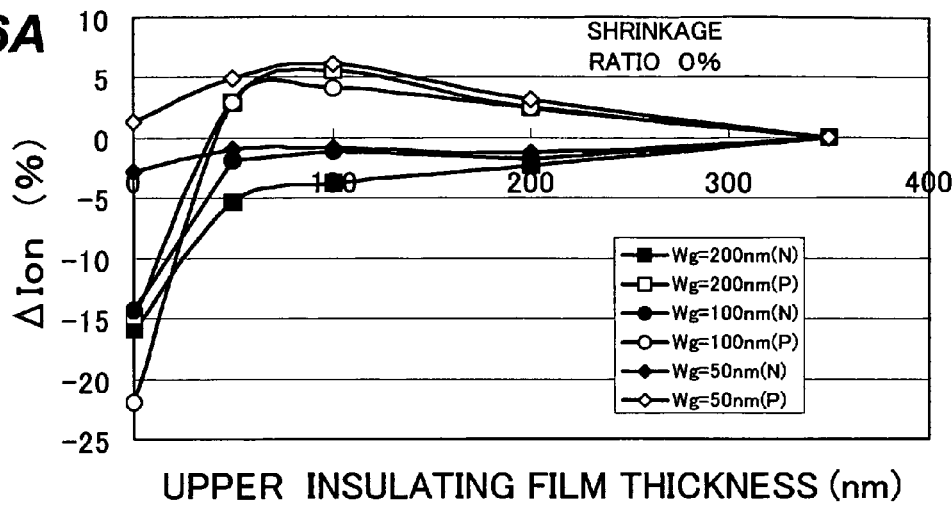
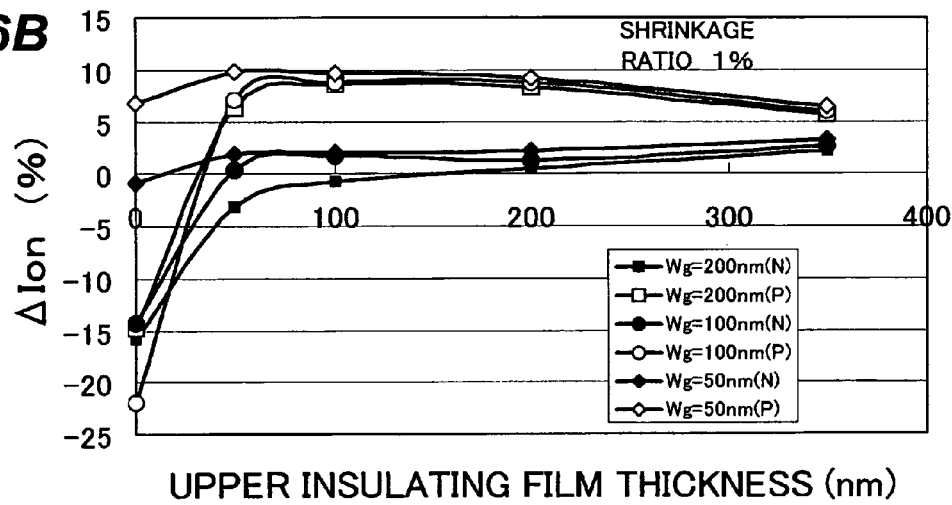
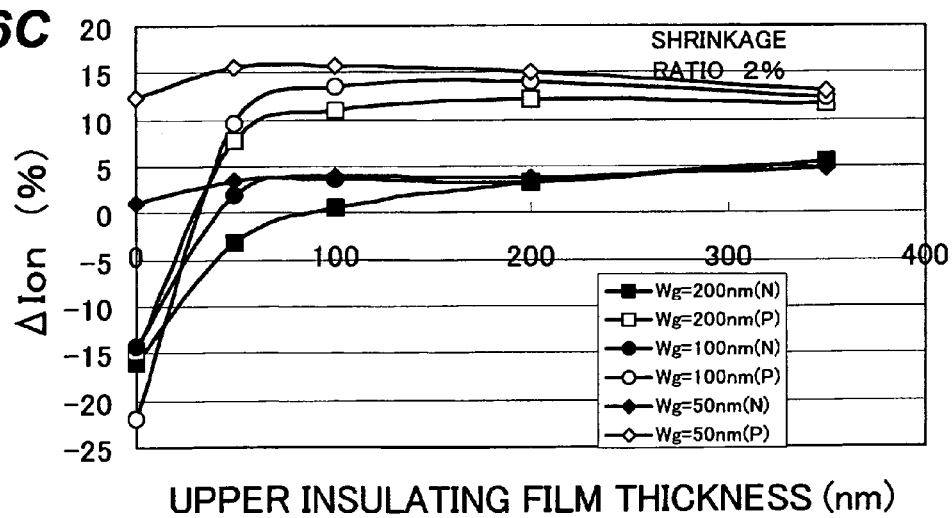

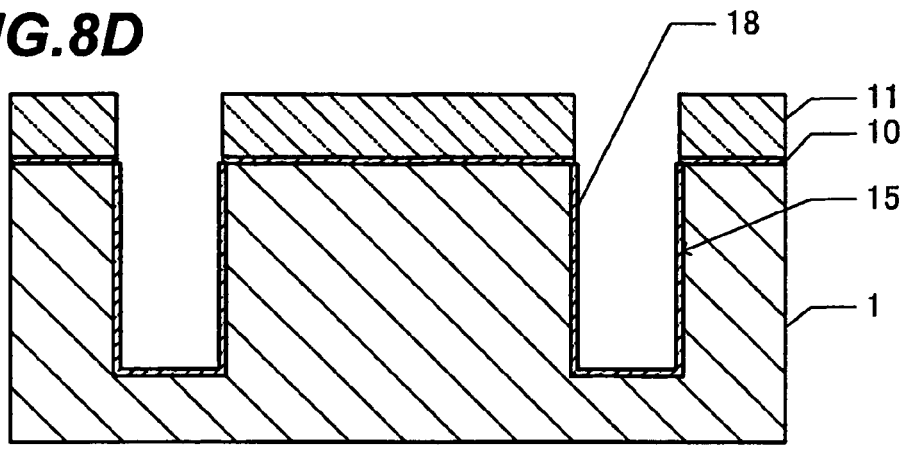
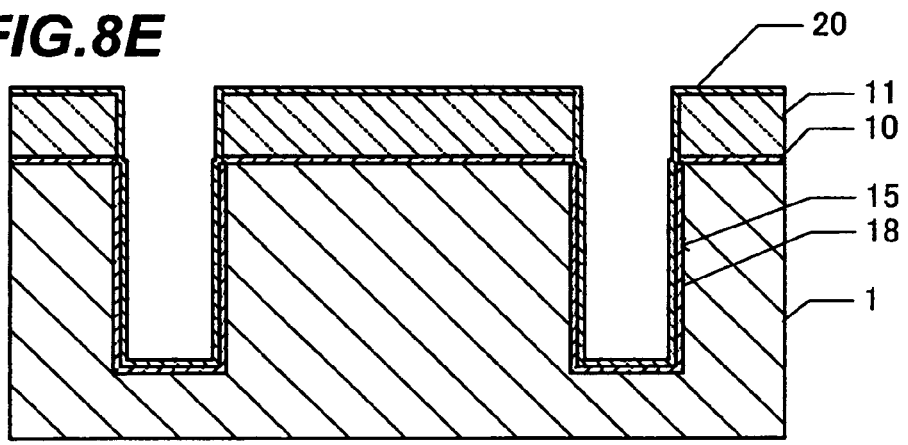
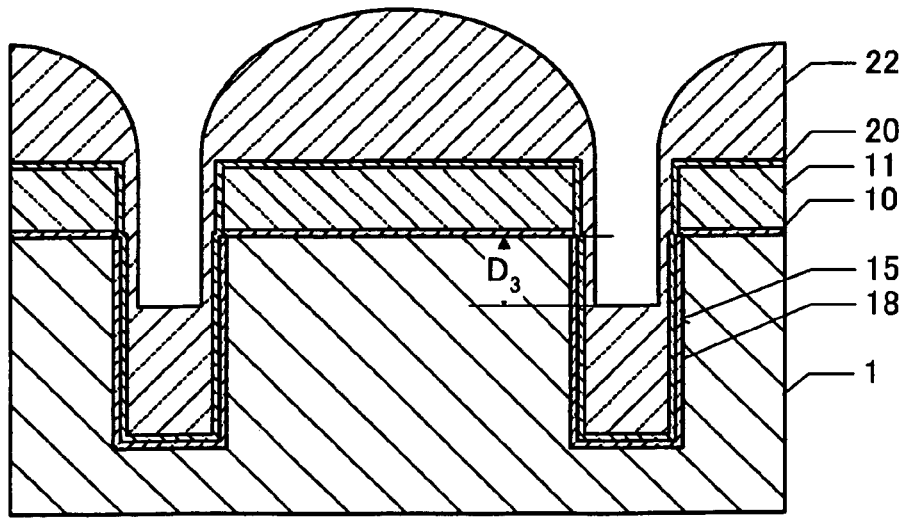

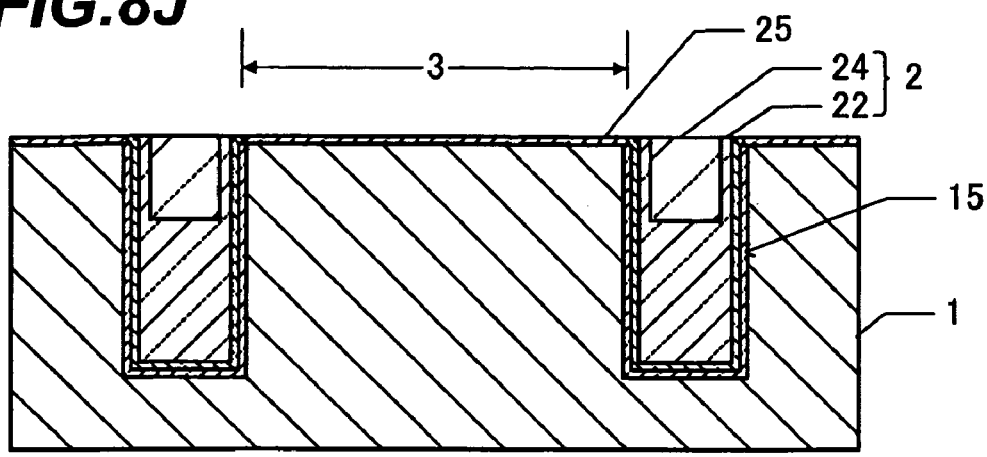
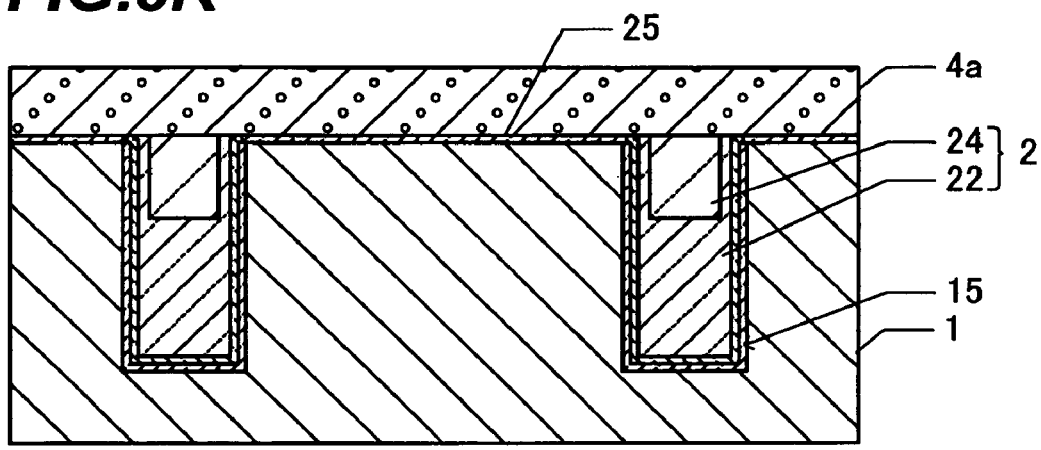

SEMICONDUCTOR DEVICE HAVING DEVICE CHARACTERISTICS IMPROVED BY STRAINING SURFACE OF ACTIVE REGION AND ITS MANUFACTURE METHOD

CROSS REFERENCE TO RELATED APPLICATION

This application is based on and claims priority of Japanese Patent Application No. 2006-094704 filed on Mar. 30, 2006, the entire contents of which are incorporated herein by reference.

BACKGROUND OF THE INVENTION

A) Field of the Invention

The present invention relates to a semiconductor device and its manufacture method, and more particularly to a semiconductor device having device characteristics improved by straining the surface of an active region by an isolation insulating layer of a shallow trench isolation (STI) structure and its manufacture method.

B) Description of the Related Art

In a semiconductor device having an STI structure, the shallow trench is filled with an insulating film formed by chemical vapor deposition (CVD) using high density plasma. Thereafter, an unnecessary insulating film is removed by chemical mechanical polishing (CMP). Compressive strain exists in a silicon oxide film deposited by CVD using high density plasma. Strain is therefore generated on the semiconductor surface in an active region. As a gate width becomes narrow, it is not possible to neglect strain caused by the stress applied to the semiconductor surface in an active region. Especially, as the gate width becomes 0.5 μm or narrower, a reduction tendency of an on-state current becomes remarkable due to strain in the channel region.

A relation between strain in a channel region of MOSFET and an amount of drain current change is disclosed in "Evaluation of change in drain current due to strain in 0.13-micrometer-node MOSFETs" by Y. Kumagai et al., Extended Abstract of the 2002 International Conference on SSDM, pp. 14-15. JP-A-P-2004-311954 discloses techniques of improving the characteristics of MOSFET by forming a strain Si layer on an SiGe layer. In this MOSFET, stress is reduced by making corners of STI structure round.

SUMMARY OF THE INVENTION

FIG. 1A is a plan view showing a general MOSFET. FIGS. 1B and 1C are cross sectional views taken along one-dot chain lines B1-B1 and C1-C1 shown in FIG. 1A, respectively. An xyz orthogonal coordinate system is defined by representing as an x-axis the <110> direction on a principal surface of a silicon substrate and representing as a y-axis a depth direction of the silicon substrate, the principal surface of which is (001) plane.

A shallow trench formed in the surface layer of a silicon substrate 1 is filled with an isolation insulating film 2. The isolation insulating film 2 defines active regions 3. A plan shape of the active region is a rectangle having sides in parallel to the x- and z-axes, respectively. A gate electrode 4 extending in the z-axis direction intersects with the active region 3.

Lg is a gate length, Wg is a gate width, Eg is a length of a potion of the gate electrode 4 protruding outside the border of the active region 3, La is a size of the active region 3 in the x-axis direction, and Ws is a distance between the border of the active region 3 and an outer peripheral line of the isolation insulating film. Generally, the isolation insulating film 2 extends continuously over the whole substrate surface area and defines a number of active regions. In this embodiment, it is assumed that the outer peripheral line of the isolation insulating film 2 is a rectangle having sides respectively in parallel to the x- and z-axes, by paying attention to only one active region 3.

During the processes of etching, surface cleaning and the like after the gate electrode 4 is formed, a surface layer of the isolation insulating film 2 is removed, and the upper surface of the isolation insulating film 2 sinks from the upper surface of the semiconductor substrate tin the active region 3. This sinking amount is represented by $D_1$ and a depth of the shallow trench is represented by $D_2$. The surface of the isolation insulating film 2 under the protruded portions of the gate electrode 4 outside the active region 3 does not sink.

As strain is generated in the channel region of MOSFET, this strain influences a drain current in the on-state. It is known that a drain current change ratio to be caused by strain in the channel region is given by the following equations:

$$\Delta I_{on}(N) = 5200\epsilon_{xx} - 9700\epsilon_{yy} + 2200\epsilon_{zz}$$

$$\Delta I_{on}(P) = -7400\epsilon_{xx} + 8200\epsilon_{yy} + 8300\epsilon_{zz} \qquad (1)$$

where $\Delta I_{on}(N)$ and $\Delta I_{on}(P)$ are drain current change ratios in the on-state of NMOSFET and PMOSFET, respectively. Parameters $\epsilon_{xx}$, $\epsilon_{yy}$, and $\epsilon_{zz}$ are strains in a channel region in x-, y- and z-directions, respectively, and a tensile strain is indicated by a positive value and a compressive strain is indicated by a negative value.

FIGS. 2A and 2B show the relation between a drain current change ratio and a gate width of NMOSFET and PMOSFET, respectively, calculated for various strains in the isolation insulating film 2. The abscissas of FIGS. 2A and 2B represent a gate width Wg in the unit of "nm" and the ordinates represent a drain current change ratio $\Delta I_{on}$ in the unit of "%". The calculations were made on the assumption that the gate length Lg was set to 90 nm, a length Eg of the protruded potion of the gate electrode 4 was set to 130 nm, the size La in the x-axis direction of the active region 3 was set to 200 nm, the distance Ws between the border of the active region 3 and an outer peripheral line of the isolation insulating film 2 was set to 1000 nm, the sinking amount $D_1$ was set to 80 nm, and the depth $D_2$ of the shallow trench was set to 300 nm.

As heat treatment is performed after the isolation insulating film 2 is formed, the isolation insulating film 2 either contracts or expands. For example, if a film immediately after formation thereof is lower density and the film changes to be higher density by the heat treatment, contraction occurs. Drain current change ratios were calculated at contraction ratios of −1%, 0%, 1%, 2% and 3%. The "contraction ratio of −1%" means an expansion by 1%. A stress in the channel region in the x- and z-directions was set to −160 MPa under the condition that neither contraction nor expansion occurs in the isolation insulating film 2. A stress applied to the channel region increases or decreases from −160 MPa by contraction and expansion of the isolation insulating film 2.

Solid lines a, b, c and d in FIGS. 2A and 2B indicate the drain current change ratios at 3%, 2%, 1%, 0% and −1%, respectively of the contraction ratios of the isolation insulating film 2. In both NMOSFET and PMOSFET, the drain current when a compressive stress exists in the isolation insulating film 2 is smaller than that when a tensile stress exists. As the contraction ratio of the isolation insulating film 2 becomes larger, or in other words, as the tensile stress in the isolation insulating film 2 becomes larger, the drain current increases. As the gate width becomes narrow, the drain current becomes likely to be influenced by a stress in the isolation insulating film 2, and a change tendency of the drain current becomes remarkable.

As the integration degree of semiconductor devices is increased and the gate width becomes very narrow, the drain current change ratio is greatly influenced by a stress in the isolation insulating film 2. It can be understood that a tensile stress in the isolation insulating film 2 suppresses a reduction in the drain current in the on-state and maintains a large drain current.

As an aspect ratio of a shallow trench becomes large, it becomes difficult to fill the shallow trench with an insulating film. It is more difficult to fill the shallow trench with the insulating film particularly when a silicon oxide film with a tensile stress is used than when a silicon oxide film with a compressive stress is used. Presently, Applied Materials, Inc. provides a method called a high aspect ratio process (HARP) of forming a silicon oxide film with a tensile stress by using ozone ($O_3$) and tetraethyl orthosilicate (TEOS).

It has been found from evaluation experiments made by the present inventors that this method is difficult to stably fill a trench having a width of 80 nm and a depth of 300 nm without generating a seam. The filling characteristics are further degraded if the trench inner surface is covered with a liner of silicon nitride.

As the high integration of semiconductor devices is advanced in the future, it can be anticipated that a width of a trench of STI structure becomes about 80 nm and a depth becomes 300 nm or deeper. Techniques are desired which can generate efficiently a tensile strain in the channel region even if a trench having a large aspect ratio is adopted.

It is an object of the present invention to provide a semiconductor device and its manufacture method capable of efficiently generating a tensile strain in a channel region even if an aspect ratio of an STI structure trench is large.

According to one aspect of the present invention, there is provided a semiconductor device comprising:

a trench formed in a surface layer of a semiconductor substrate and surrounding active regions;

a lower insulating film made of insulating material and embedded in a lower space of the trench; and an upper insulating film embedded in a space of the trench above the lower insulating film, the upper insulating film having therein a stress generating tensile strain in a surface layer of each active region.

According to another aspect of the present invention, there is provided a semiconductor device manufacture method comprising the steps of:

(a) forming a trench in a surface layer of a semiconductor substrate, the trench surrounding active regions;

(b) depositing a lower insulating film made of insulating material on the semiconductor device, the lower insulating film being embedded in a lower space of the trench and leaving a void in an upper space;

(c) depositing an upper insulating film having therein a tensile stress on the lower insulating film, the upper insulating film burying the void left in the upper space; and (d) removing the upper insulating film and the lower insulating film deposited on the semiconductor substrate other than in the trench.

It improves the device characteristics that the upper insulating film generates a tensile strain in the surface layer of the active region. Since the lower space of the trench is filled with the lower insulating film, an aspect ratio of the space to be filled with the upper insulating film becomes smaller than that when the whole space of the trench is filled with the upper insulating film. The filling characteristics can therefore be improved.

BRIEF DESCRIPTION OF THE DRAWINGS

FIGS. 6A to 6C are graphs showing the relation between a drain current change ratio and a thickness of an upper insulating film constituting an isolation insulating film at 0%, 1% and 2% of the contraction ratios, calculated for various gate widths.

FIGS. 8A to 8K are cross sectional views illustrating of a semiconductor device during manufacture in a method of manufacturing a semiconductor device according to a second embodiment.

DESCRIPTION OF THE PREFERRED EMBODIMENTS

Figure 1A:
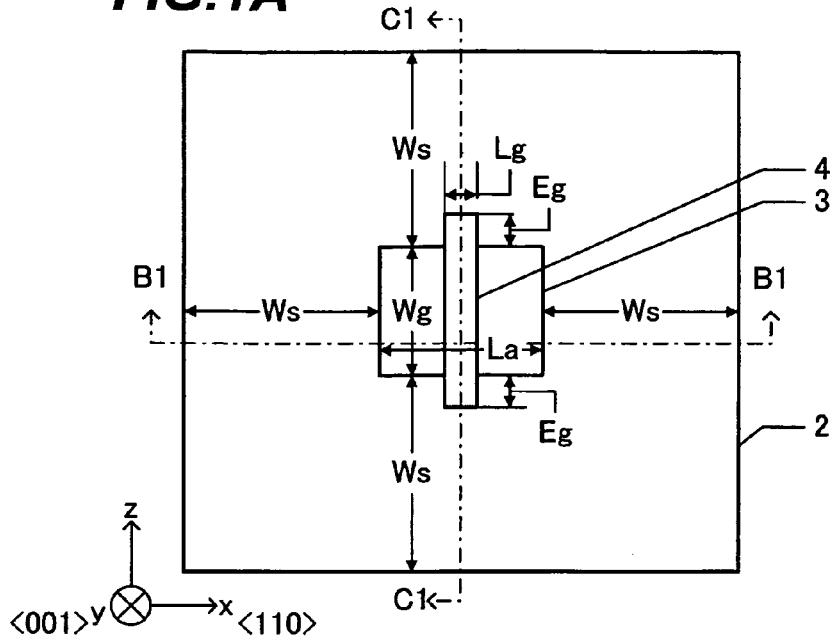
FIG. 1A is a plan view showing a semiconductor device according to a reference example.
Figure 1B:
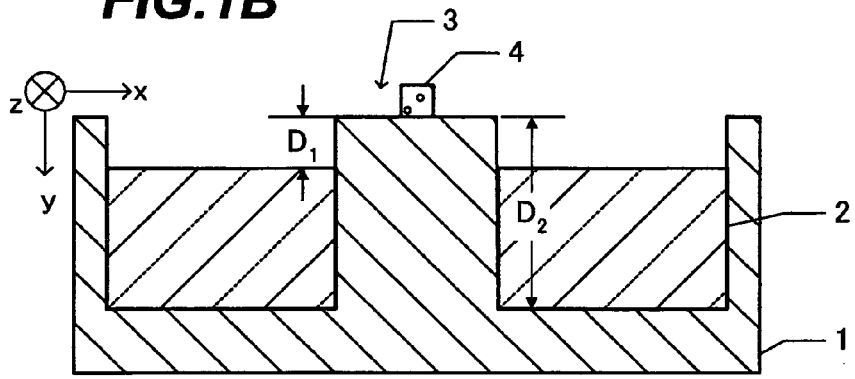
FIGS. 1B and 1C are cross sectional views taken along one-dot chain lines B1-B1 and C1-C1 shown in FIG. 1A, respectively.
Figure 1C:
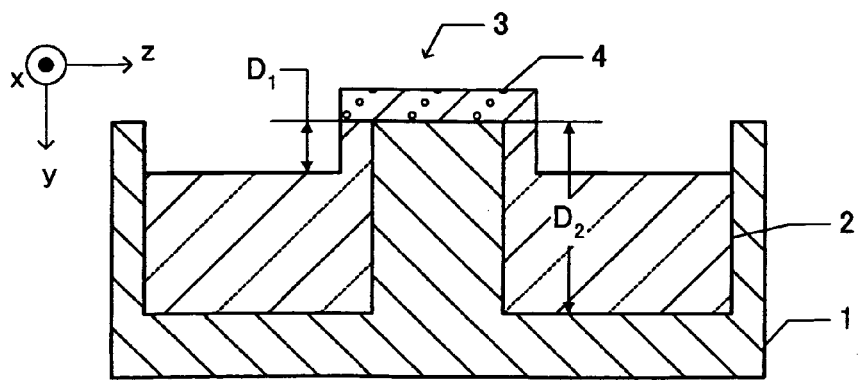
Figure 2A:
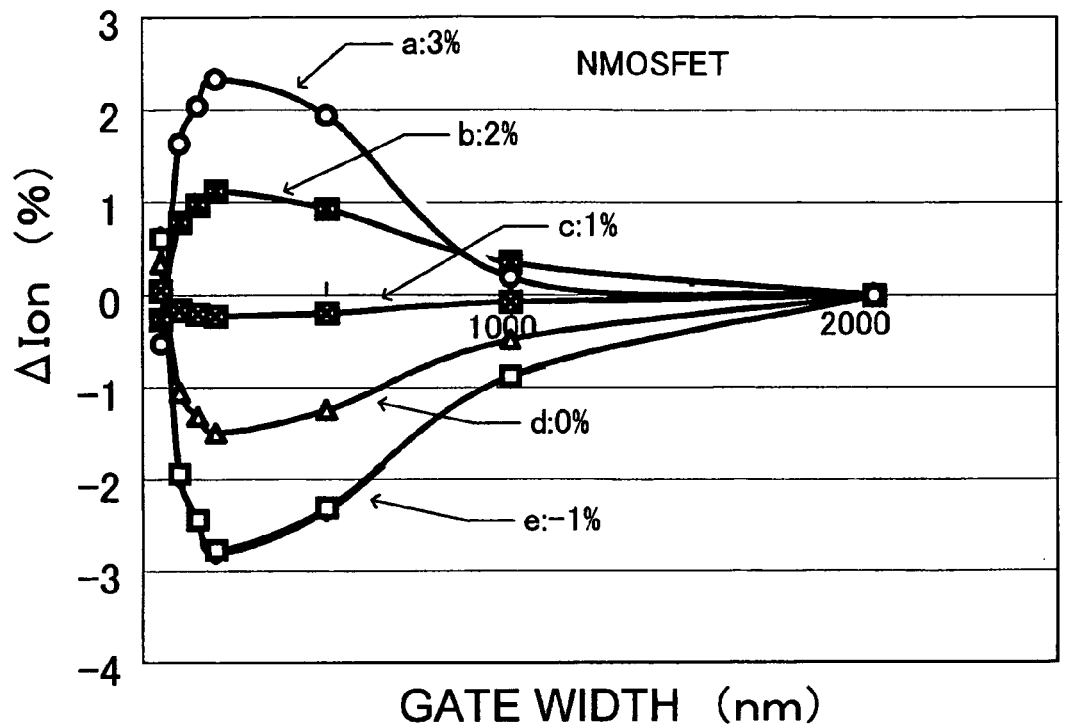
FIGS. 2A and 2B are graphs showing the relation between a drain current change ratio and a gate width of NMOSFET and PMOSFET, respectively, calculated for each contraction ratio of an isolation insulating film.
Figure 2B:
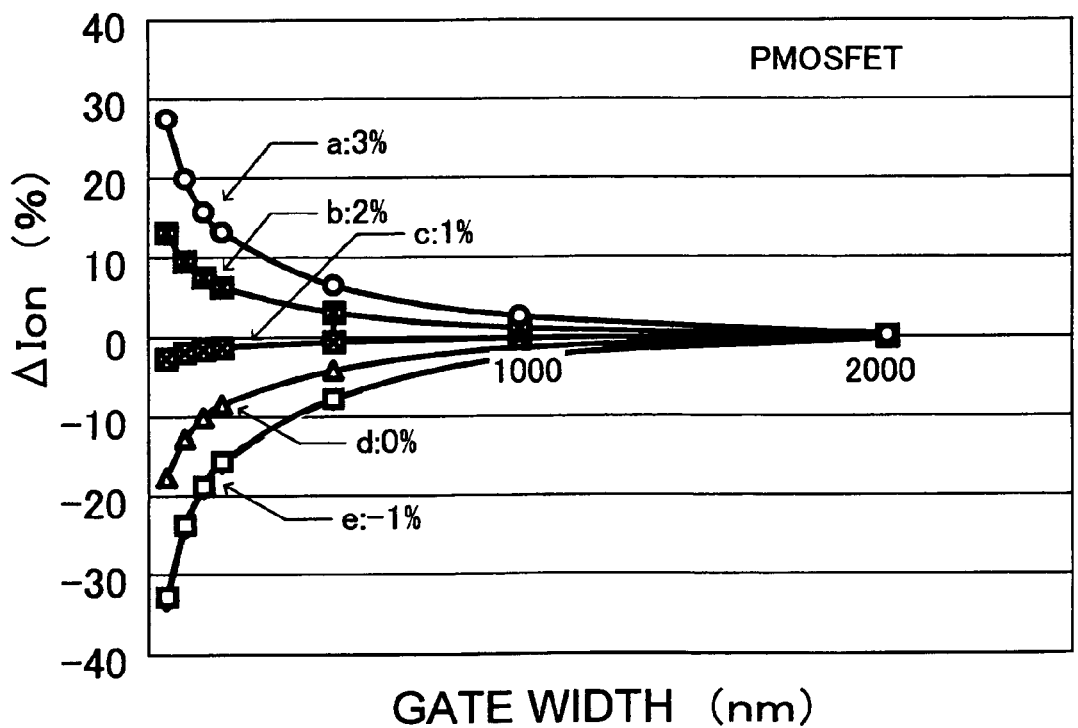
Figure 3A:
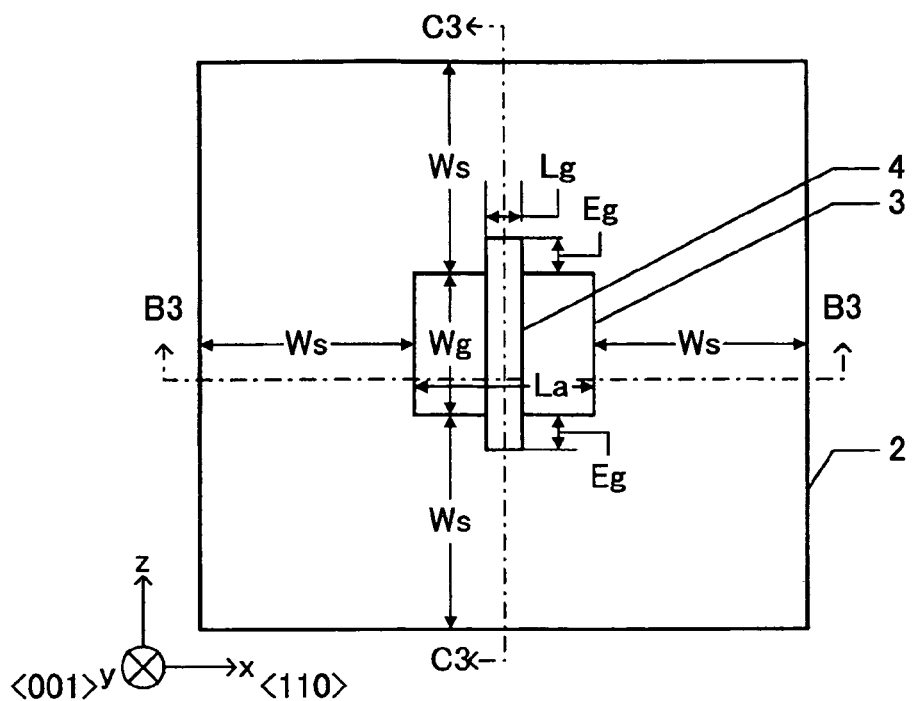
FIG. 3A is a plan view of a semiconductor device according to a first embodiment.
Figure 3B:
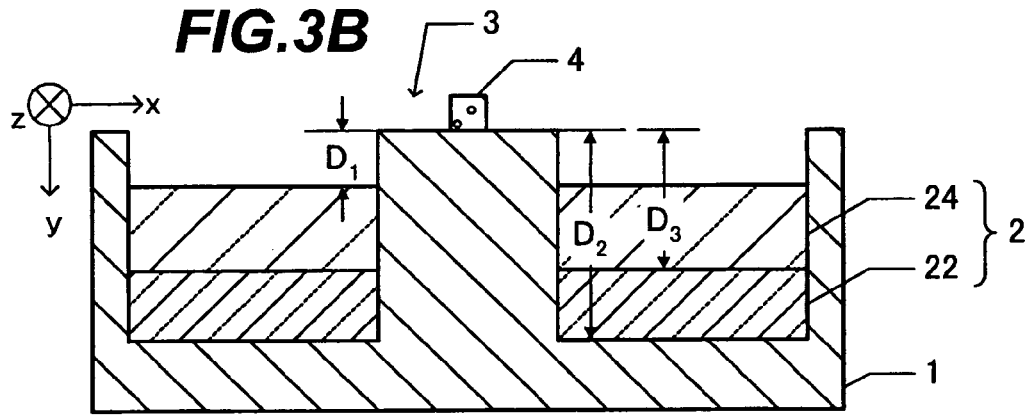
FIGS. 3B and 3C are cross sectional views taken along one-dot chain lines B3-B3 and C3-C3 shown in FIG. 3A, respectively.
Figure 3C:
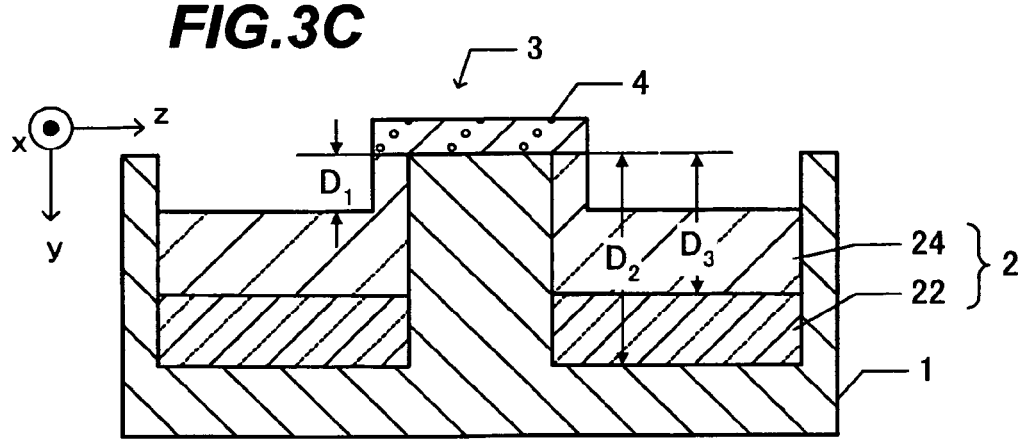

FIG. 3A is a plan view of a semiconductor device according to the first embodiment, and FIGS. 3B and 3C are cross sectional views taken along one-dot chain lines B3-B3 and C3-C3 shown in FIG. 3A, respectively. The plan view shown in FIG. 3A is the same as the plan view shown in FIG. 1A, and the description thereof is omitted.

As shown in FIGS. 3B and 3C, a lower insulating film 22 fills a lower space of a trench formed in the surface layer of a semiconductor substrate 1 made of silicon. An upper insulating film 24 fills a space of the trench upper than the lower insulating film 22. The lower insulating film 22 and upper insulating film 24 constitute an isolation insulating film 2. The isolation insulating film 2 defines active region 3.

The upper surface of the isolation insulating film 2 sinks from the upper surface of the active region 3 by a depth $D_1$. The upper surface of the upper insulating film 24 does not sink under the projected portions of a gate electrode 4 at both ends thereof, and has the approximately same level as the upper surface of the active region 3. $D_2$ is a depth of the trench, and $D_3$ is a depth from the upper surface of the active region 3 to the interface between the lower insulating film 22 and upper insulating film 24, i.e., a thickness of the upper insulating film 24 at the protruded portions of the gate electrode 4. If the depth $D_3$ is shallower than the depth $D_1$, the lower insulating film 22 is exposed on the upper surface of the isolation insulating film 2, and the upper insulating film 24 is disposed only under the protruded portions of the gate electrode 4.

A compressive stress exists in the lower insulating film 22 in the x- and z-directions, and a tensile stress exists in the upper insulating film 24 in the x- and z-directions.

Figure 4A:
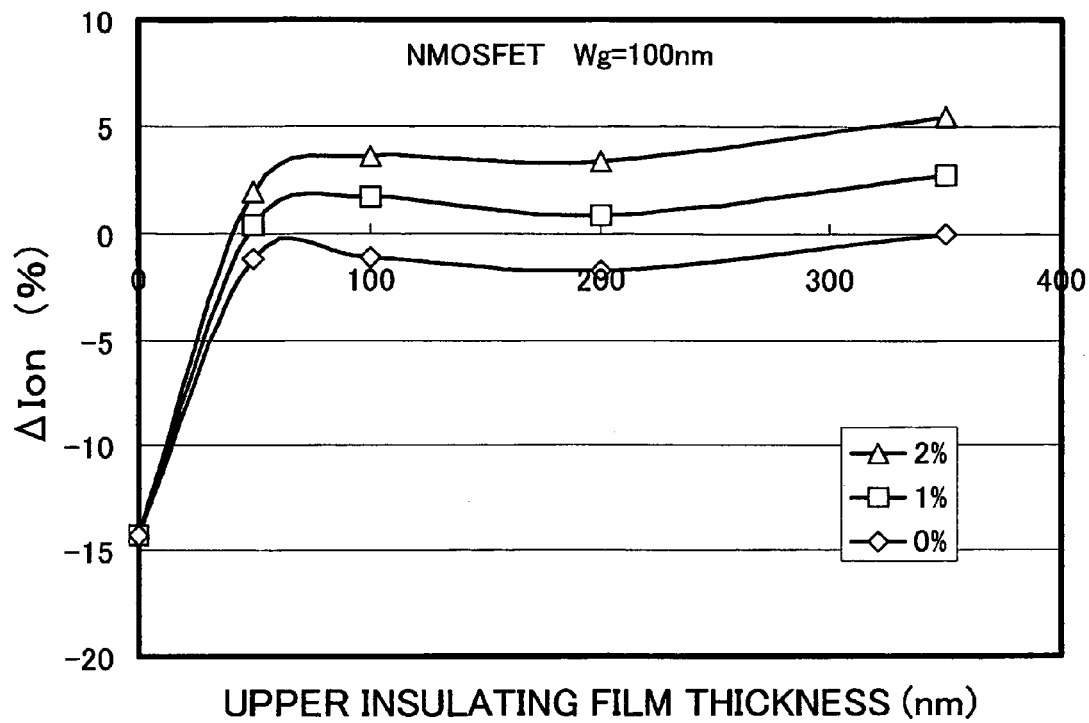
FIGS. 4A and 4B are graphs showing the relation between a drain current change ratio and a thickness of an upper insulating film constituting an isolation insulating film of NMOSFET and PMOSFET, respectively, calculated for various contraction ratios of the upper insulating film.
Figure 4B:
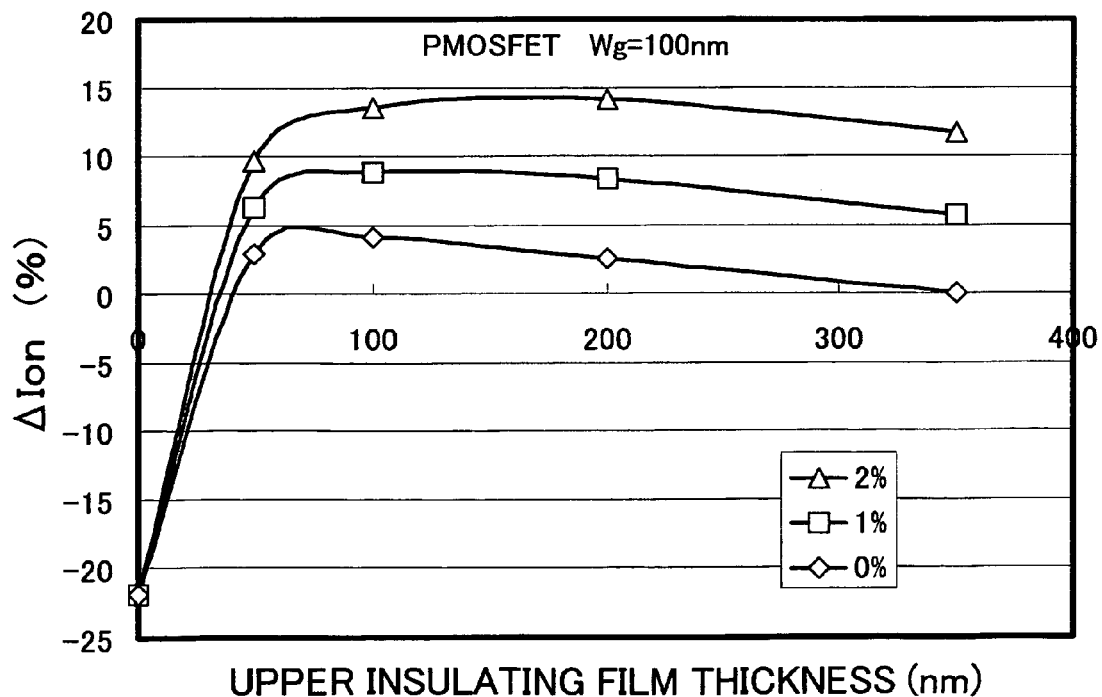

FIGS. 4A and 4B are graphs showing the relation between a drain current change ratio and a thickness of the upper insulating film 24 of NMOSFET and PMOSFET, respectively, calculated at 0%, 1% and 2% of the contraction ratios of the upper insulating film 24. The abscissa represents a thickness of the upper insulating film 24 in the unit of "nm" and the ordinate represents a drain current change ratio $\Delta I_{on}$ in the unit of "%". In FIGS. 4A and 4B, rhomboid, square and triangle symbols represent the drain current change ratios at 0%, 1% and 2% of the contraction ratios, respectively. The drain current change ratio indicates a change ratio of the drain current to the drain current ($I_{on}$) in the on-state at a gate width of 2000 nm, in the insulating film embedded at each contraction ratio. In the state that contraction or expansion of the isolation insulating film 2 does not exist, the stress in the channel region was set to −160 MPa in the x- and z-directions. If the isolation insulating film 2 contracts at each contraction ratio, the stress applied to the channel region increases from −160 MPa and strain in the tensile direction is generated in the channel region. The stress in the lower insulating film 22 was set to −300 MPa in the x- and z-directions.

Calculations were performed on the assumption that the gate width Wg was set to 100 nm, the gate length Lg was set to 90 nm, the length Eg of the protruded portion of the gate electrode 4 was set to 130 nm, the size La of the active region 3 in the x-direction was set to 200 nm, the distance Ws from the border of the active region 3 to the outer peripheral line of the isolation insulating film 2 was set to 1000 nm, the sinking amount $D_1$ was set to 80 nm, and the trench depth $D_2$ was set to 350 nm. The evaluation point at 350 nm of the thickness of the upper insulating film 24 corresponds to the structure that the lower insulating film 22 is not formed and the whole space in the trench is filled with the upper insulating film 24. The evaluation point at 50 nm of the thickness of the upper insulating film 24 corresponds to the structure that the upper surface of the lower insulating film 22 is exposed and the upper insulating film 24 is disposed only under the protruded portions of the gate electrode 4 in FIG. 3C.

As shown in FIG. 4A, the drain current change ratio of NMOSFET is positive at the contraction ratios of 1% and 2% if the thickness of the upper insulating film 24 is 50 nm or thicker. Even if the upper insulating film 24 is made thicker than 50 nm, the drain current change ratio has almost no change. The drain current change ratio of PMOSFET is positive at the contraction ratios of 0 to 2% if the thickness of the upper insulating film 24 is 50 nm or thicker. In the range of the thickness of the upper insulating film 24 of 50 nm or thicker, the drain current change ratio has almost no change. It can be understood from these results that the stress existing in the shallow region of the isolation insulating film 2 influences strain in the channel region and the stress existing in the deep region influences it hardly. In order to obtain sufficient effects to generate a tensile strain in the channel region, it is preferable to set the thickness of the upper insulating film 24 to 50 nm or thicker.

Figure 5A:
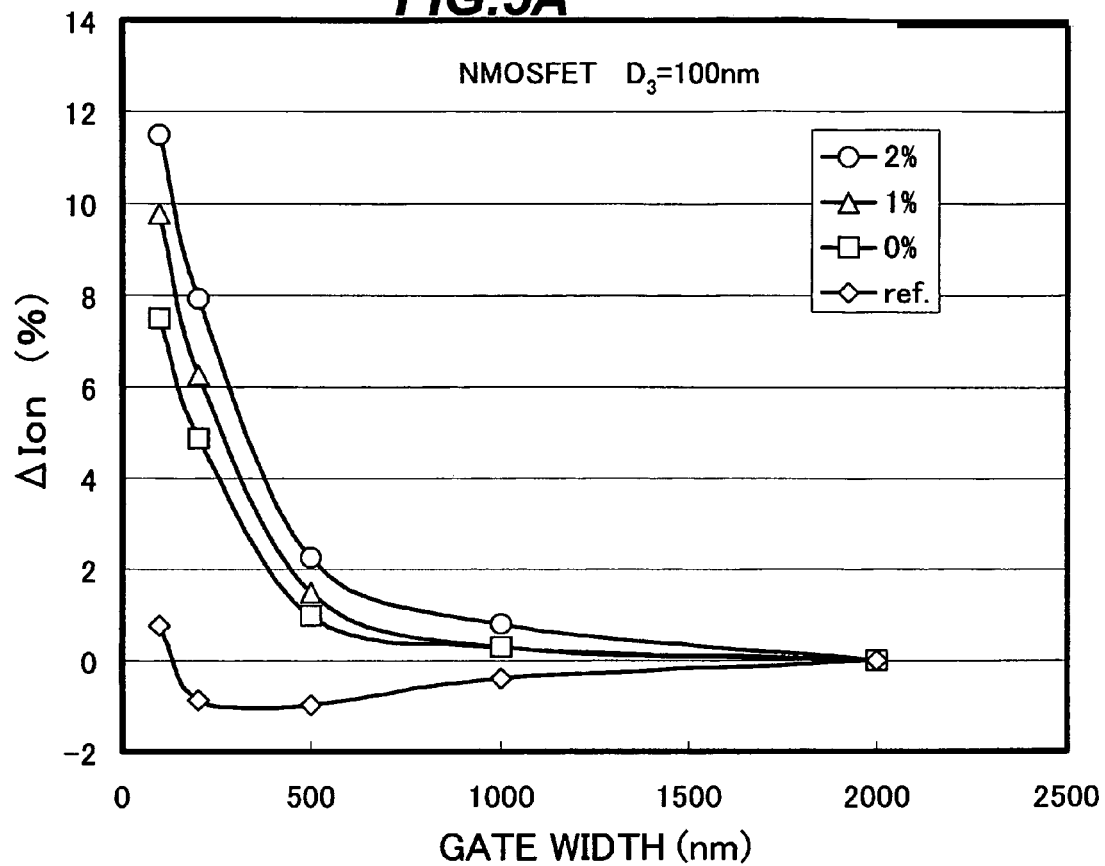
FIGS. 5A and 5B are graphs showing the relation between a drain current change ratio and a gate width of NMOSFET and PMOSFET, respectively, calculated for various contraction ratios of an upper insulating film.
Figure 5B:
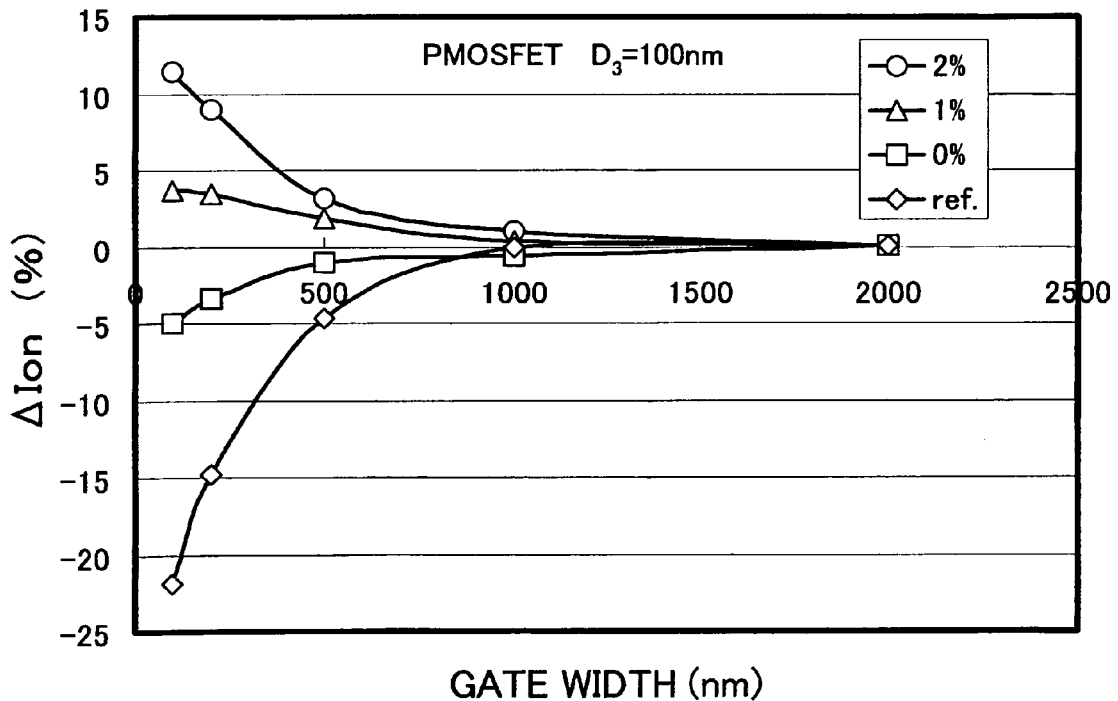

FIGS. 5A and 5B are graphs showing the relation between a drain current change ratio and a gate width of NMOSFET and PMOSFET, respectively, calculated at 0%, 1% and 2% of the contraction ratios of the upper insulating film 24. For a reference example, the drain current change ratio of a semiconductor device is shown in which only the lower insulating film 22 having a stress of −300 MPa in the x- and z-directions fills the trench. The abscissa represents a gate width Wg in the unit of "nm" and the ordinate represents a drain current change ratio $\Delta L_{on}$ in the unit of "%". The drain current change ratio indicates a change ratio of the drain current to the drain current ($I_{on}$) in the on-state at a gate width of 2000 nm in the insulating film embedded at each contraction ratio and the stress of −300 MPa. In FIGS. 5A and 5B, rhomboid, square and triangle and circle symbols represent the drain current change ratios of the reference example and examples at 0%, 1% and 2% of the contraction ratios of the upper insulating film 24, respectively.

Calculations were performed on the assumption that the gate length Lg was set to 90 nm, the length Eg of the protruded portion of the gate electrode 4 was set to 130 nm, the size La of the active region 3 in the x-direction was set to 200 nm, the distance Ws from the border of the active region 3 to the outer peripheral line of the isolation insulating film 2 was set to 1000 nm, the sinking amount $D_1$ was set to 80 nm, the trench depth $D_2$ was set to 350 nm, and the thickness $D_3$ of the upper insulating film 24 was set to 100 nm.

In the reference example of NMOSFET, it can be understood that as the gate width becomes narrow, the drain current change ratio increases in the negative direction and the drain current reduces, in the gate width range of 2000 nm to 200 nm. In contrast, if the upper region of the isolation insulating film 2 is replaced with the upper insulating film 24 having a tensile strain, it can be understood that the drain current change ratio does not become negative but increases in the positive direction even as the gate width becomes narrow.

In the reference example of PMOSFET, it can be understood that as the gate width becomes narrow, the drain current change ratio increases in the negative direction and the drain current reduces, in the gate width range of 2000 nm to 100 nm. If the upper portion of the isolation insulating film 2 is replaced with the upper insulating film 24 having a tensile strain, it can be understood that the drain current change ratio does not become negative but increases in the positive direction even as the gate width becomes narrow, as in the case of NMOSFET.

By disposing the upper insulating film 24 having the tensile stress, reduction in the drain current can be prevented even if the gate width becomes narrow. The effects of disposing the upper insulating film 24 are remarkable particularly in the gate width range of 500 nm or narrower.

FIGS. 6A to 6C are graphs showing the relation between a drain current change ratio and a thickness of the upper insulating film 24 calculated for gate widths of 50 nm, 100 nm and 200 nm. The abscissa represents a thickness of the upper insulating film 24 in the unit of "nm" and the ordinate represents a drain current change ratio $\Delta I_{on}$ in the unit of "%". The drain current change ratio indicates a change ratio of the drain current to the drain current ($I_{on}$) in the on-state at a contraction ratio of 0%, a thickness of the upper insulating film of 350 nm, end when gate widths are respectively 50 nm, 100 nm and 200 nm. In FIGS. 6A to 6C, heavy symbols indicate the drain current change ratios of NMOSFETs and outline symbols indicate the drain current change ratios of PMOSFETs. Rhomboid, circle and square symbols represent the drain current change ratios at the gate widths Wg of 50 nm, 100 nm and 200 nm, respectively. FIGS. 6A, 6B and 6C correspond to 0%, 1% and 2% of the contraction ratios of the upper insulating film 24, respectively.

Calculations were performed on the assumption that the gate length Lg was set to 90 nm, the length Eg of the protruded portion of the gate electrode 4 was set to 130 nm, the size La of the active region 3 in the x-direction was set to 200 nm, the distance Ws from the border of the active region 3 to the outer peripheral line of the isolation insulating film 2 was set to 1000 nm, the sinking amount $D_1$ was set to 80 nm, and the trench depth $D_2$ was set to 350 nm.

At each case where the gate is in a range between 50 nm and 200 nm, the drain current change ratio changes from a large negative value to a value near to 0 or to a positive value, by disposing the upper insulating film 24 compared to the case where the upper insulating film 24 is not disposed, i.e., a thickness of the upper insulating film 24 is 0. As a thickness of the upper insulating film 24 becomes 50 nm or thicker, a change in the drain current change ratio becomes gentle. As seen from these evaluation results, it is preferable to set a thickness of the upper insulating film 24 to 50 nm or thicker independently from the contraction ratio of the upper insulating film 24 and the gate width.

Figure 7A:
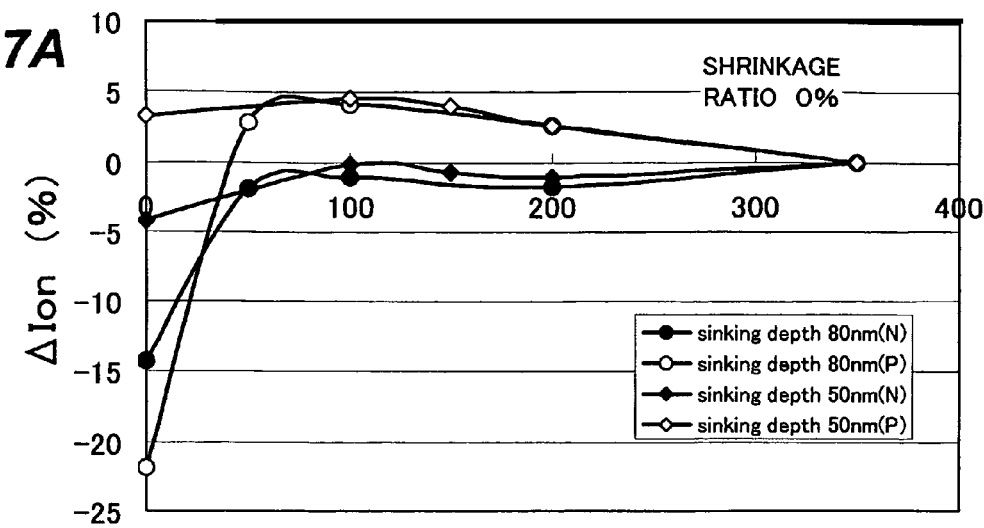
FIGS. 7A to 7C are graphs showing the relation between a drain current change ratio and a thickness of an upper insulating film constituting an isolation insulating film at 0%, 1% and 2% of the contraction ratios of the upper insulating film, calculated for various sinking amounts of the upper surface of the isolation insulating film.
Figure 7B:
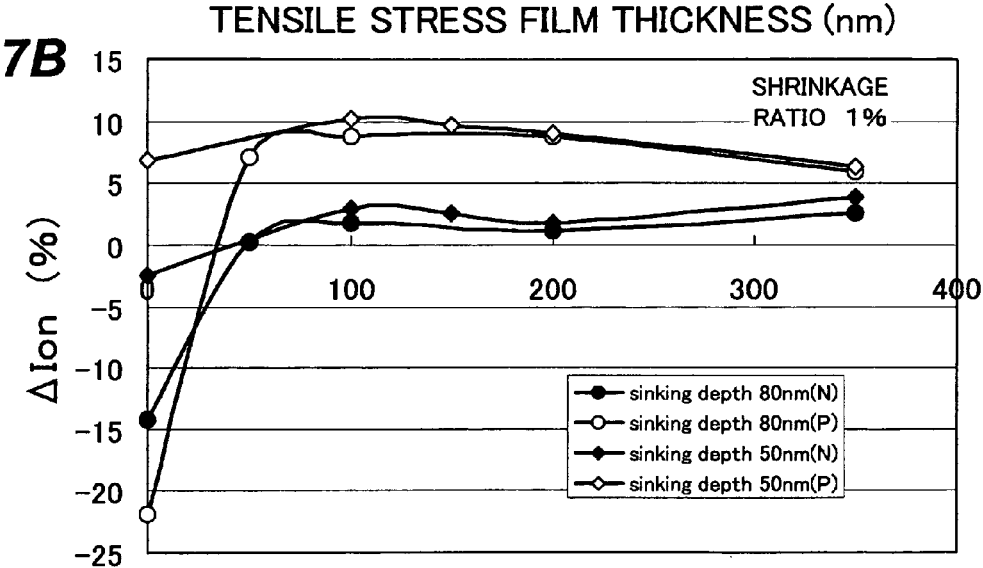
Figure 7C:
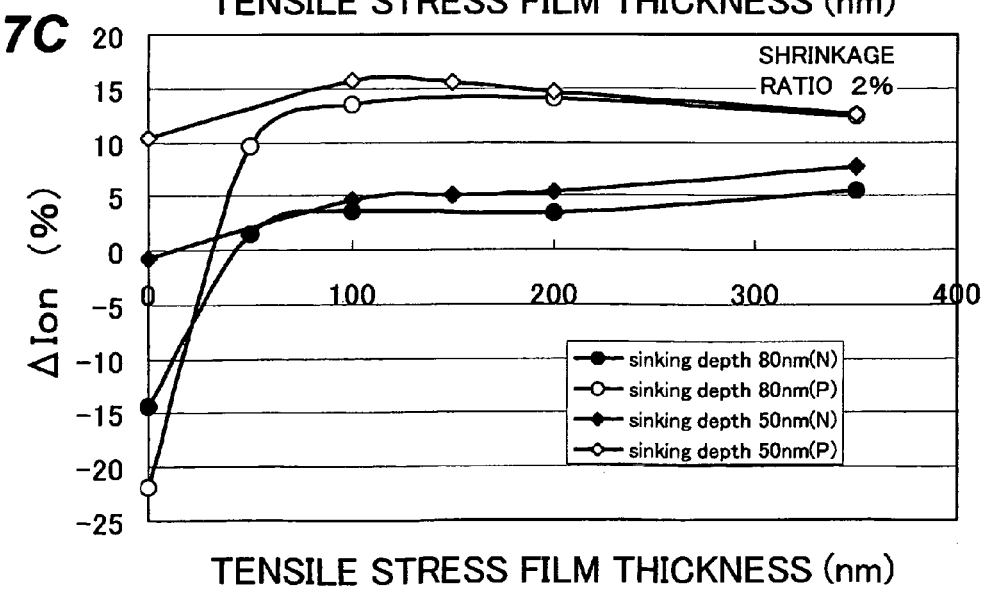

FIGS. 7A to 7C are graphs showing the relation between a drain current change ratio and a thickness of the upper insulating film 24 in cases where the sinking amounts $D_1$ of the upper insulating film 24 are 50 nm and 80 nm. The abscissa represents a thickness of the upper insulating film 24 in the unit of "nm" and the ordinate represents a drain current change ratio $\Delta I_{on}$ in the unit of "%". The drain current change ratio indicates a change ratio of the drain current to the drain current ($I_{on}$) in the on-state at a contraction ratio of 0%, a thickness of the upper insulating film of 350 nm, when sinking depths are 50 nm and 80 nm. In FIGS. 7A to 7C, heavy symbols indicate the drain current change ratios of NMOSFETs and outline symbols indicate the drain current change ratios of PMOSFETs. Rhomboid and circle symbols represent the drain current change ratios at the sinking depths of 50 nm and 80 nm. FIGS. 7A, 7B and 7C correspond to 0%, 1% and 2% of the contraction ratios of the upper insulating film 24, respectively.

Calculations were performed on the assumption that the gate width Wg was set to 100 nm, the gate length Lg was set to 90 nm, the length Eg of the protruded portion of the gate electrode 4 was set to 130 nm, the size La of the active region 3 in the x-direction was set to 200 nm, the distance Ws from the border of the active region 3 to the outer peripheral line of the isolation insulating film 2 was set to 1000 nm, and the trench depth $D_2$ was set to 350 nm.

In the range of the sinking depth $D_1$ from 50 nm to 80 nm, the drain current change ratio changes from a large negative value to a value near to 0 or to a positive value, by disposing the upper insulating film 24. As a thickness of the upper insulating film 24 becomes 50 nm or thicker, a change in the drain current change ratio becomes gentle. As seen from these evaluation results, it is preferable to set a thickness of the upper insulating film 24 to 50 nm or thicker independently from the contraction ratio of the upper insulating film 24 and the sinking depth.

In the first embodiment described above, a tensile strain is generated in the channel region by making the upper insulating film 24 have a tensile stress. The tensile stress in the upper insulating film 24 is not necessarily required to distribute uniformly in the whole insulating film, but the tensile stress may have a stress distribution in the film, if only a tensile strain can be generated in the channel region. For example, an upper insulating film 24 may be disposed having the stress distribution that a stress does not exist in the central area of the upper insulating film 24, but the tensile stress exists only in a peripheral area of the upper insulating film 24.

Next, with reference to FIGS. 8A to 9B, description will be made on a semiconductor device manufacture method according to the second embodiment.

Figure 8A:
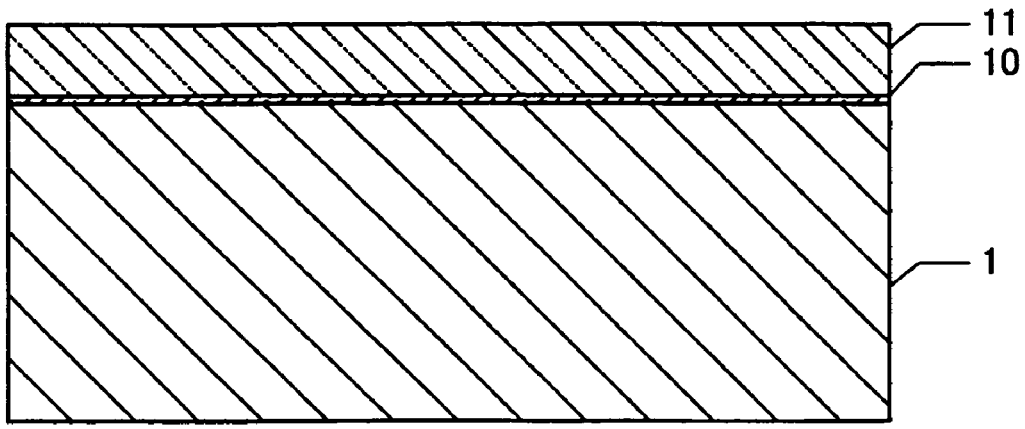

As shown in FIG. 8A, a principal surface of a semiconductor substrate 1 made of silicon is thermally oxidized to form a silicon oxide film 10. A thickness of the silicon oxide film 10 is set to 9 to 21 nm, for example, 10 nm. On the silicon oxide film 10, a silicon nitride film 11 is formed having a thickness of 100 to 150 nm, for example, 110 nm. The silicon nitride film 11 is formed by low pressure chemical vapor deposition (LPCVD) using mixture gas of $SiCl_2H_2$ and $NH_3$ at a substrate temperature of 750° C. to 800° C.

Figure 8B:
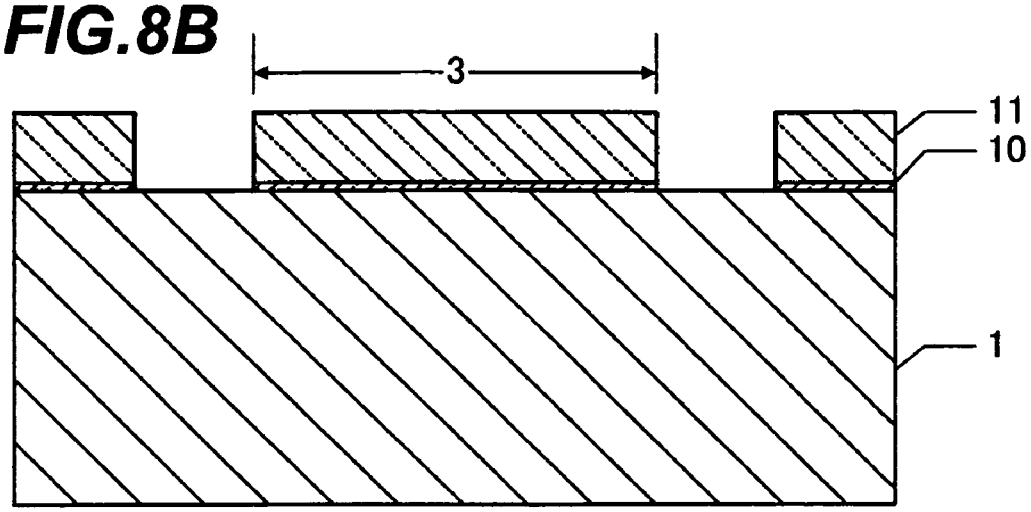

As shown in FIG. 8B, an opening corresponding to an isolation insulating film to be formed is formed through the silicon nitride film 11 and silicon oxide film 10 by usual photolithography techniques. A width of the opening is 0.07 µm to 1 µm. Etching the silicon nitride film 11 and silicon oxide film 10 is performed by reactive ion etching (RIE) using mixture gas of $CF_4$, $CHF_3$ and Ar.

Figure 8C:
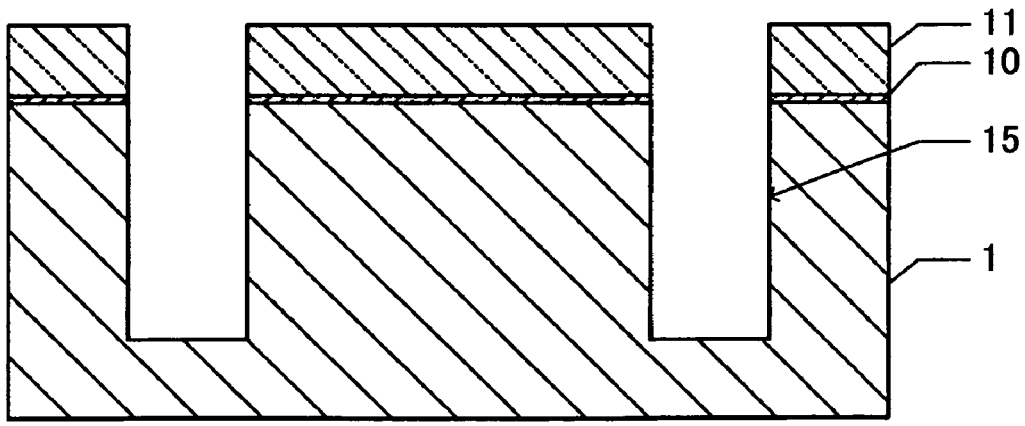

As shown in FIG. 8C, by using the silicon nitride film 11 as an etching mask, the surface layer of the semiconductor substrate 1 is etched to form a trench 15. A depth of the trench 15 is 250 nm to 350 nm, e.g., 300 nm. Etching the semiconductor substrate 1 is performed by RIE using mixture gas of HBr and $O_2$ or mixture gas of $Cl_2$ and $O_2$.

As shown in FIG. 8D, the inner surface of the trench 15 is thermally oxidized to form a silicon oxide liner 18 having a thickness of 3 nm to 10 nm, e.g., 3 nm.

As shown in FIG. 8E, a silicon nitride liner 20 having a thickness of about 20 nm is formed covering the inner surface of the trench 15 and the surface of the silicon nitride film 11. Forming the silicon nitride liner 20 is performed by LPCVD using mixture gas of $SiCl_2H_2$ and $NH_3$ as source gas at a substrate temperature of about 650° C. Since the silicon nitride liner 20 is thinner than the silicon nitride film 11 used as the etching mask for forming the trench 15, the substrate temperature is set lower than that set for depositing the silicon nitride film 11 to lower the film forming speed rate.

The silicon nitride liner 20 has a function of protecting the inner surface of the trench from a during etching process and the like. If the silicon nitride liner 20 has a thickness of 20 nm, it is possible to ensure an adhesion strength sufficient for preventing the silicon nitride liner 20 from being peeled off during a subsequent process. As the source gas for forming the silicon nitride liner 20, mixture gas of SiH$_4$ and NH$_3$, mixture gas of SiCl$_4$ and NH$_3$, bistertialbutylaminosilane or the like may also be used.

The substrate, on which the silicon nitride liner 20 is formed, is placed in a chamber of an inductive coupled high density plasma CVD system, and pre-annealing is performed for 1 min. to 5 min. at a temperature of 400° C. to 450° C.

As shown in FIG. 8F, a lower insulating film 22 made of silicon oxide is deposited over the substrate in such a manner that the film fills a lower partial region of the trench 15 and an empty space is left in the upper region. For example, the lower insulating film 22 is deposited to set the depth $D_3$ to 100 nm from the upper surface of the semiconductor substrate to the upper surface of the lower insulating film 22 filling the lower partial region of the trench 15. The deposition conditions of the lower insulating film 22 are as follows:

Substrate temperature: 400° C. to 450° C.;
Source Gases: SiH$_4$, O$_2$;
Sputtering gas: Ar.

If the depth of the trench 15 is 300 nm and the lower insulating film is deposited to a thickness of 500 nm on the flat surface of the substrate, the depth $D_3$ of 100 nm is obtained from the upper surface of the semiconductor substrate 1 to the upper surface of the lower insulating film 22. Since Ar functioning as sputtering gas is mixed when the lower insulating film 22 is deposited, both depositing the lower insulating film 22 and sputtering the deposited lower insulating film 22 progress at the same time. Since the lower insulating film 22 deposited on the edge of the opening of the trench 15 is removed by sputtering, it is possible to prevent a void from being formed.

Figure 8G:
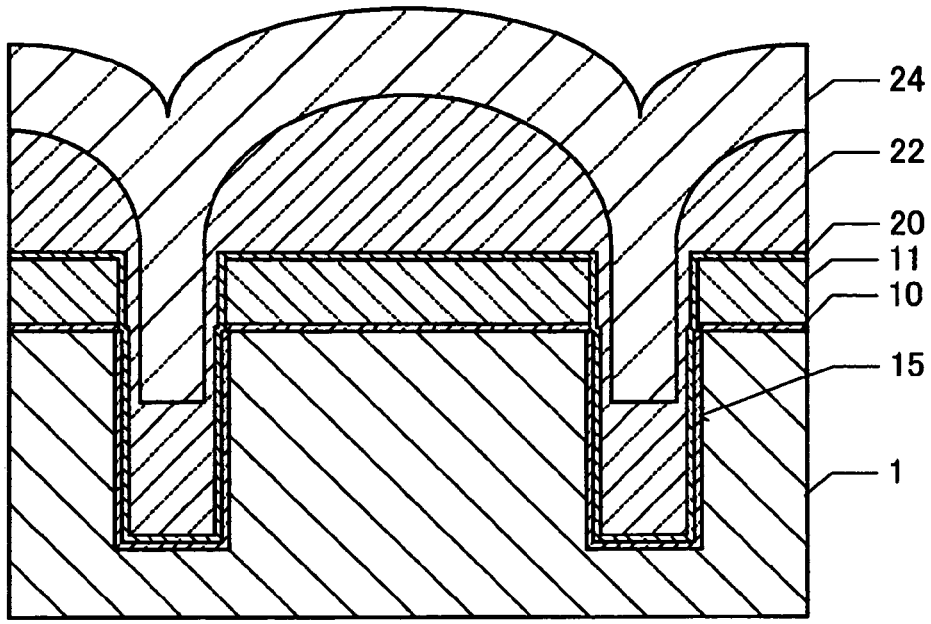

As shown in FIG. 8G, an upper insulating film 24 made of silicon oxide is deposited on the lower insulating film 22 in the same chamber to completely fill the inside of the trench 15. The deposition conditions of the upper insulating film 24 are as follows:

Substrate temperature: 200° C. to 300° C.;
Source Gases: SiH$_4$, O$_2$;
Sputtering gas: Ar.

Since the upper insulating film 24 is deposited at the substrate temperature lower than that set for depositing the lower insulating film 22, the upper insulating film 24 has a density lower than that of the lower insulating film 22. After the upper insulating film 24 is deposited, heat treatment is performed at a substrate temperature, e.g., 500° C. or higher, which is higher than that set for depositing the upper insulating film 24. This heat treatment makes the upper insulating film 24 dense. In other words, a tensile stress exists in the upper insulating film 24. A compressive stress remains in the lower insulating film 22.

In order to make the tensile stress exist in the upper insulating film 24 by the heat treatment, it is preferable to set the substrate temperature to 300° C. or lower when depositing the upper insulating film 24. However, if the substrate temperature is lowered too much, the filling characteristics in the trench 15 are degraded. It is therefore preferable to set the substrate temperature to 200° C. or higher. A heat treatment temperature is preferably set to 500° C. or higher.

As the substrate temperature is lowered, the filling characteristics in the trench 15 are degraded. In order to fill the trench 15 with the lower insulating film 22 without generating a void, it is preferable to set the substrate temperature to 400° C. or higher. when depositing the lower insulating film 22. When the upper insulating film 24 is deposited, the lower region in the trench 15 is already filled with the lower insulating film 22, 50 that the upper region of the trench 15 can be filled with good reproductivity even at a relatively low substrate temperature.

Figure 8H:
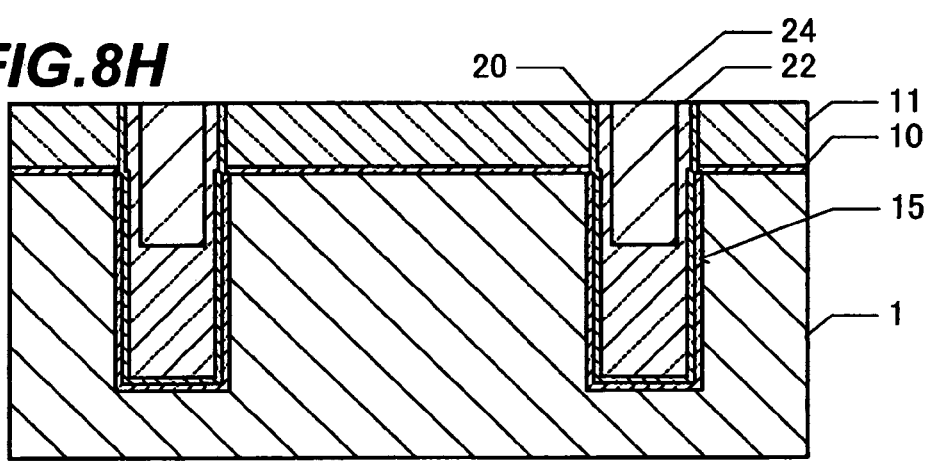

As shown in FIG. 8H, the lower insulating film 22 and upper insulating film 24 deposited at a higher level than the silicon nitride liner 20 on the flat surface are removed by chemical mechanical polishing (CMP) under the condition that a polishing rate of silicon oxide is faster than a polishing rate of silicon nitride. The lower insulating film 22 and upper insulating film 24 are therefore left only in the trench 15. This CMP also removes the thin silicon nitride liner 20 covering the upper surface of the silicon nitride film 11 and exposes the silicon nitride film 11.

In the state shown in FIG. 8H, the upper insulating film 24 and the lower insulating film 22 deposited on the side wall of the trench 15 are etched with hydrofluoric acid to the intermediate depth of the silicon nitride film 11. Next, the silicon nitride film 11 is etched with phosphoric acid to expose the underlying silicon oxide film 10. At this time, the upper insulating film 22 and lower insulating film 24 are etched slightly. Lastly, the silicon oxide film 10 is etched with hydrofluoric acid to expose the surface of the semiconductor substrate 1.

Figure 8I:
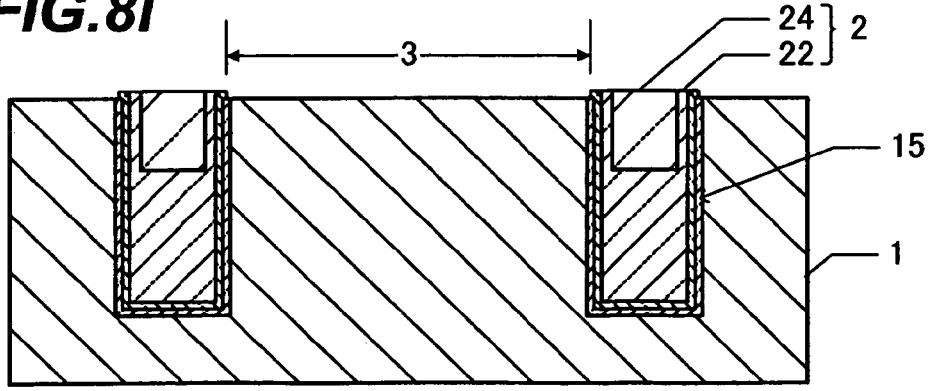

FIG. 8I shows the state after the silicon oxide film 10 is removed. The etching conditions are controlled when etching the upper insulating film 22, lower insulating film 24, silicon nitride film 11 and silicon oxide film 10 in the state shown in FIG. 8H so that the lower insulating film 22 and upper insulating film 24 protrude slightly from the surface of the semiconductor substrate 1. The lower insulating film 22 and upper insulating film 24 in the trench 15 constitute the isolation insulating film 2 which defines the active region 3.

As shown in FIG. 8J, the exposed surface of the semiconductor substrate 1 is thermally oxidized to form a gate insulating film 25 made of silicon oxide. For example, if the gate insulating film 25 is formed to a thickness of 1 nm, the upper surface thereof rises by about 0.5 nm from the surface of the initial semiconductor substrate 1. The protrusion amount of the upper insulating film 24 and lower insulating film 22 shown in FIG. 8I is controlled in such a manner that the upper surface of the upper insulating film 24 and the upper surface of the gate insulating film 25 have the same level.

As shown in FIG. 8K, a polysilicon film 4a is deposited by CVD on the isolation insulating film 2 and gate insulating film 25.

Figure 9A:
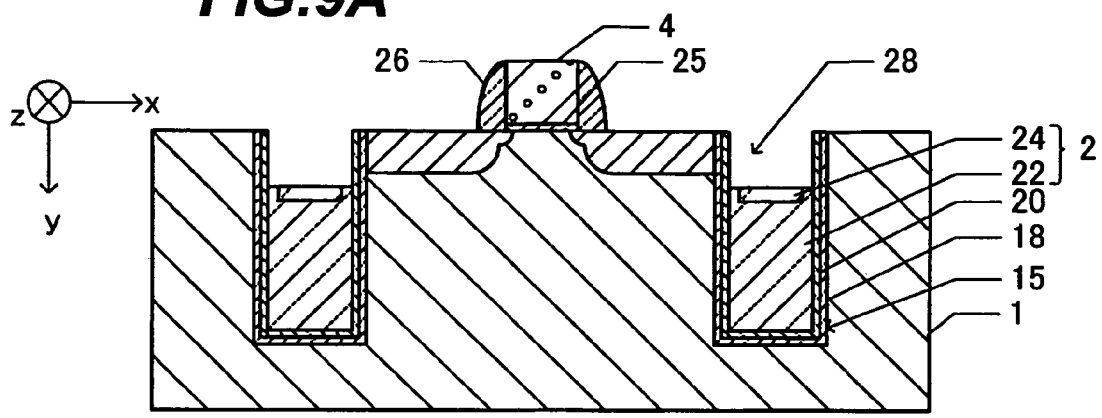
FIGS. 9A and 9B are cross sectional views of the semiconductor device of the second embodiment.
Figure 9B:
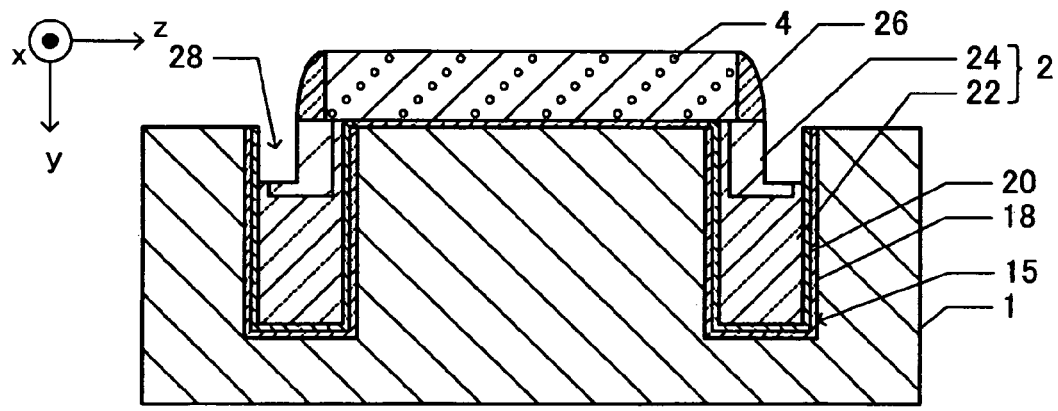

Description will be made on the processes of completing the semiconductor device of the second embodiment shown in FIGS. 9A and 9B. FIGS. 9A and 9B are cross sectional views taken along one-dot chain lines B3-B3 and C3-C3 shown in FIG. 3A.

First, the polysilicon film 4a is patterned to leave a gate electrode 4. By using the gate electrode 4 as a mask, ions are implanted into the surface layer of the semiconductor substrate 1 to form extensions of source/drain regions. Sidewall spacers 26 of silicon oxide or the like are formed on the sidewalls of the gate electrode 4. By using the gate electrode 4 and sidewall spacers 26 as a mask, ions are implanted to form deep source/drain regions.

The isolation insulating film 2 is etched during the etching process of forming the gate electrode 4 and sidewall spacers 26, the ashing process of ashing the resist pattern used as the mask for ion implantation, other washing processes and the like. Therefore, the upper surface of the isolation insulating film 2 sinks below the surface of the semiconductor substrate 1 to form a sunk portion 28. A sinking depth is about 50 nm to 100 nm. The isolation insulating film 2 does not sink under the end portions of the gate electrode 4 protruding outside the border of the active region and under the sidewall spacers 26 formed on the sidewalls of the gate electrode 4.

During the processes of etching, ashing and the like for forming MOSFET, the silicon nitride liner 20 formed on the inner surface of the trench 15 is hard to be etched more than the isolation insulating film 2 made of silicon oxide. The silicon nitride liner 20 functions therefore as a protective film. It is therefore possible to prevent the semiconductor substrate 1 made of silicon from being exposed.

Since a tensile stress exists in the upper insulating film 24 left under the end portions of the gate electrode 4, a tensile stress in the gate width direction (z direction) is applied to the channel region under the gate electrode 4 and tensile strain $\epsilon_{zz}$ is generated in the z direction. As seen from the equations (1), drain current increases in both NMOSFET and PMOSFET.

As shown in FIG. 9A, since the sunk portion 28 is formed in the cross section in parallel to the gate length direction, the upper insulating film 24 is not left in the very shallow layer of the semiconductor substrate 1. Therefore, a tensile stress in the x direction is hard to be applied to the channel region. Namely, $\epsilon_{xx}$ in the equations (1) is smaller than $\epsilon_{zz}$. In the equation (1) for calculating the drain current change ratio of PMOSFET, although the coefficient of $\epsilon_{xx}$ is negative, the drain current change ratio is positive because $\epsilon_{zz}$ is sufficiently larger than $\epsilon_{xx}$.

In order to make the strain amount $\epsilon_{xx}$ sufficiently smaller than $\epsilon_{zz}$, it is preferable to set the sinking amount $D_1$ of the upper surface of the isolation insulating film 2 to 50 nm or deeper.

Next, with reference to FIGS. 10A to 11B, description will be made on a semiconductor device manufacture method according to the third embodiment.

Figure 10A:
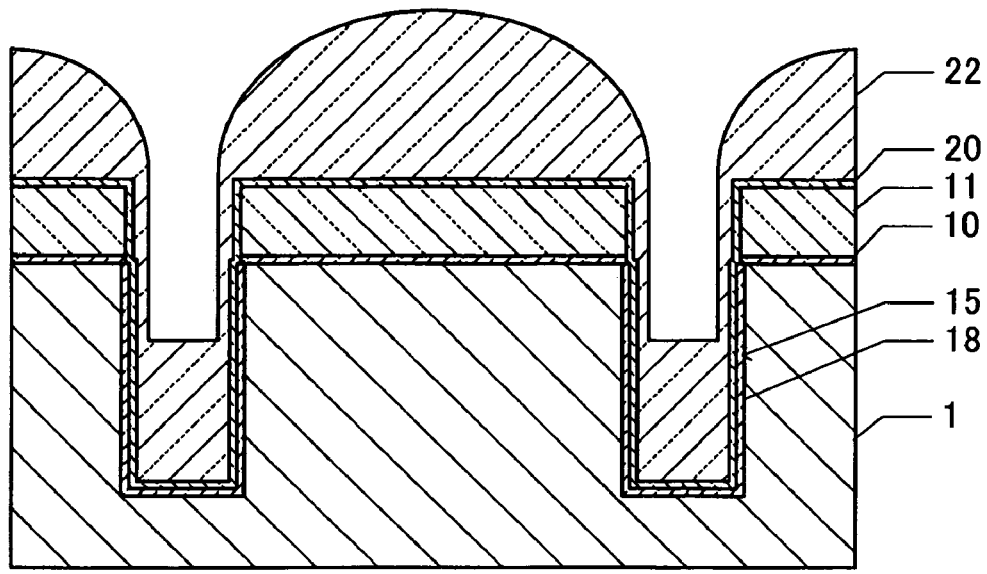
FIGS. 10A and 10B are cross sectional views illustrating a semiconductor device during manufacture in a method of manufacturing a semiconductor device according to a third embodiment.

As shown in FIG. 10A, a lower insulating film 22 is formed by the same processes as those up to the state shown in FIG. 8F of the second embodiment. In the second embodiment, the upper insulating film 24 is deposited after the lower insulting film 22 is deposited. In the third embodiment, prior to depositing the upper insulating film 24, the substrate is immersed in HF aqueous solution having a density of 0.5% for 30 seconds to etch the surface layer of a lower insulating film 22.

Figure 10B:
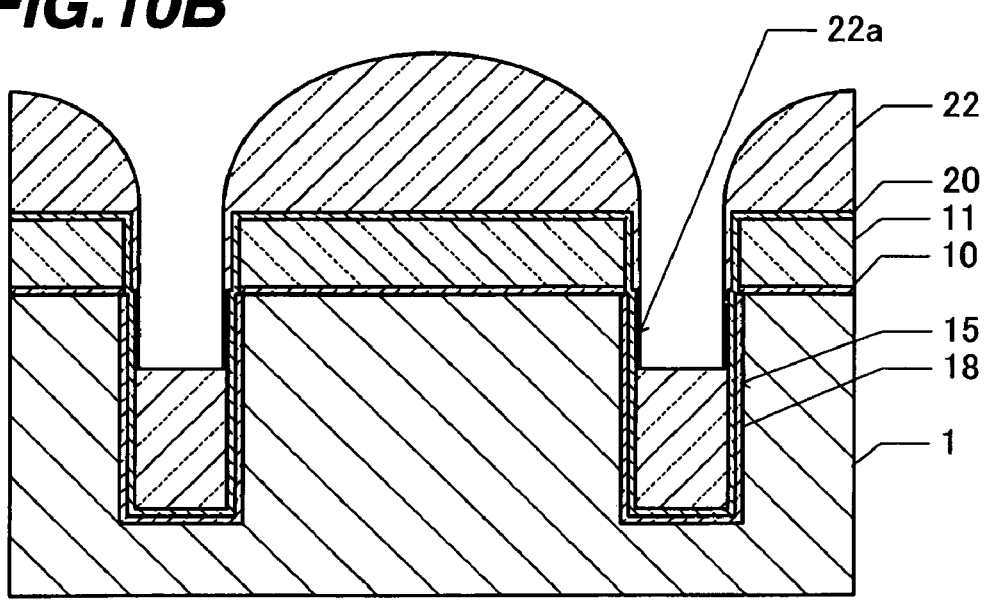

As shown in FIG. 10B, this HF process thins a sidewall portion 22a of the lower insulating film 22 deposited on the side surface of the trench 15. The subsequent processes are the same as those after the state of the second embodiment shown in FIG. 8G.

Figure 11A:
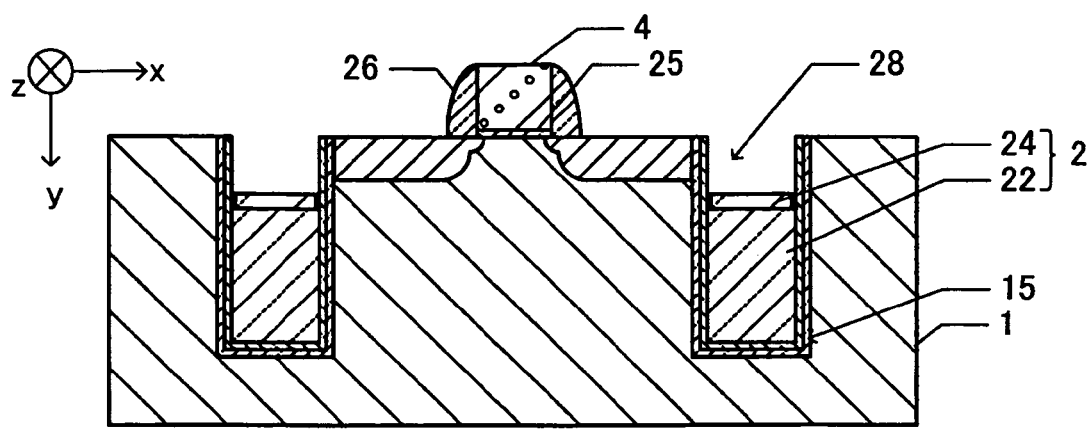
FIGS. 11A and 11B are cross sectional views of the semiconductor device of the third embodiment.
Figure 11B:
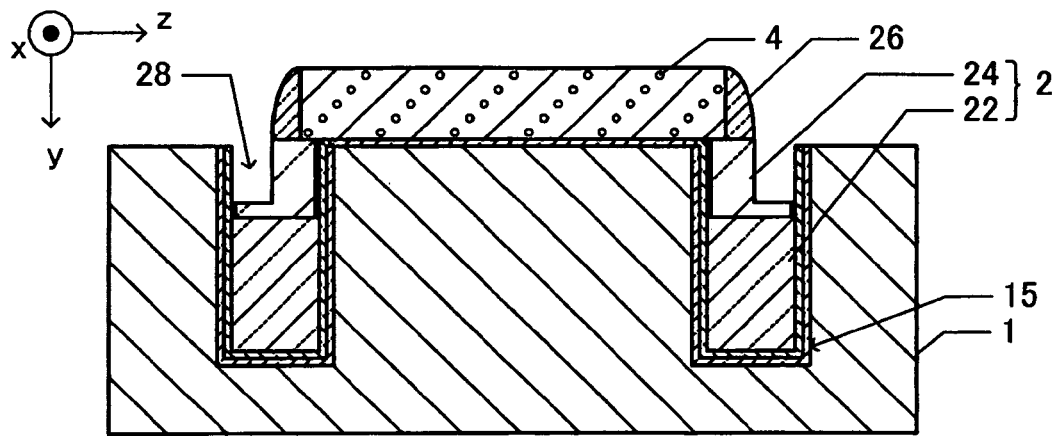

FIGS. 11A and 11B correspond to the cross sectional views taken along one-dot chain lines B3-B3 and C3-C3 shown in FIG. 3A, respectively. As shown in FIGS. 11A and 11B, the lower insulating film 22 left between the upper insulating film 24 and the side surface of the trench 15 is thinner than the lower insulating film 22 of the semiconductor device of the second embodiment shown in FIGS. 9A and 9B. Therefore, a ratio of the region occupied by the upper insulating film 24 having therein a tensile stress to the region occupied by the isolation insulating film 2 becomes large. A larger strain can therefore be generated in the channel region.

In the third embodiment, the filling characteristics of the upper insulating film 24 can be improved when the upper insulating film 24 is deposited on the lower insulating film 22 shown in FIG. 10B. Since the inner surface of the trench 15 is covered with the silicon nitride liner 20, it is possible to prevent the semiconductor substrate 1 from being exposed on the inner surface of the trench 15.

In the third embodiment, although the surface layer of the lower insulating film 22 is etched with HF aqueous solution, the surface layer may be removed by other chemical etching. Instead of chemical etching, the surface layer may be removed by sputtering or the like. For example, the surface layer of the lower insulating film 22 may be sputtered by using Ar plasma. This sputtering can be performed by the plasma CVD system used for depositing the lower insulating film 22 and upper insulating film 24. Therefore, sputtering can be performed continuously in the same chamber without transporting the substrate to another etching system.

Next, with reference to FIG. 12A to 13B, description will be made on a semiconductor device manufacture method according to the fourth embodiment.

Figure 12A:
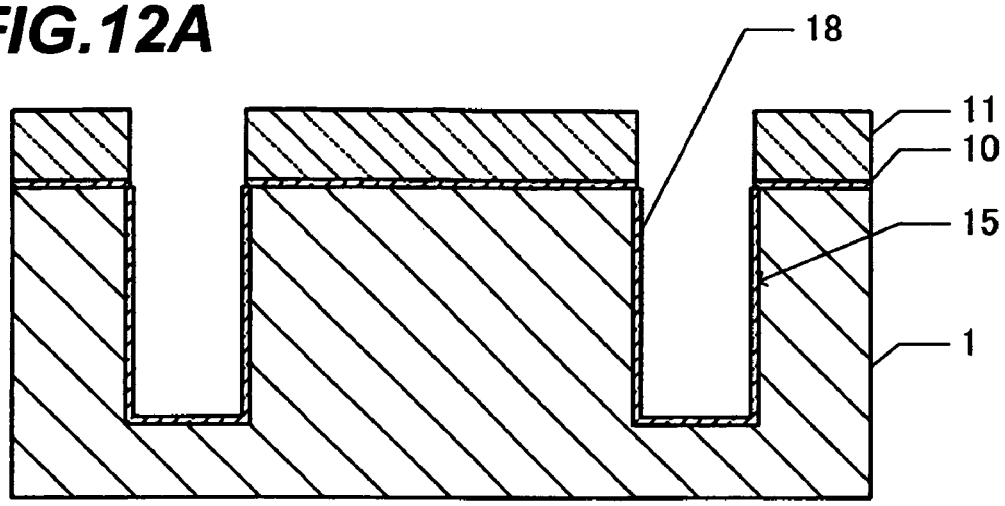
FIGS. 12A and 12B are cross sectional views illustrating a semiconductor device during manufacture in a method of manufacturing a semiconductor device according to a fourth embodiment.

As shown in FIG. 12A, a silicon oxide liner 18 is formed by the same processes as those up to the state shown in FIG. 8D of the second embodiment. In the fourth embodiment, the silicon nitride liner 20 of the second embodiment shown in FIG. 8E is not formed.

Figure 12B:
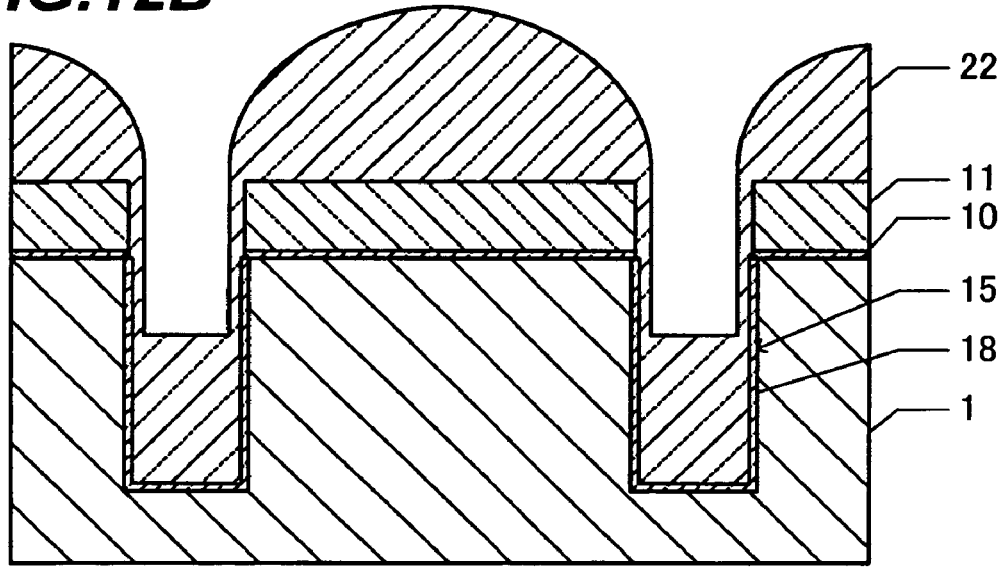

As shown in FIG. 12B, an upper insulating film 22 is deposited filling a partial region in the trench 15. The subsequent processes are the same as those after the state of the second embodiment shown in FIG. 8G.

Figure 13A:
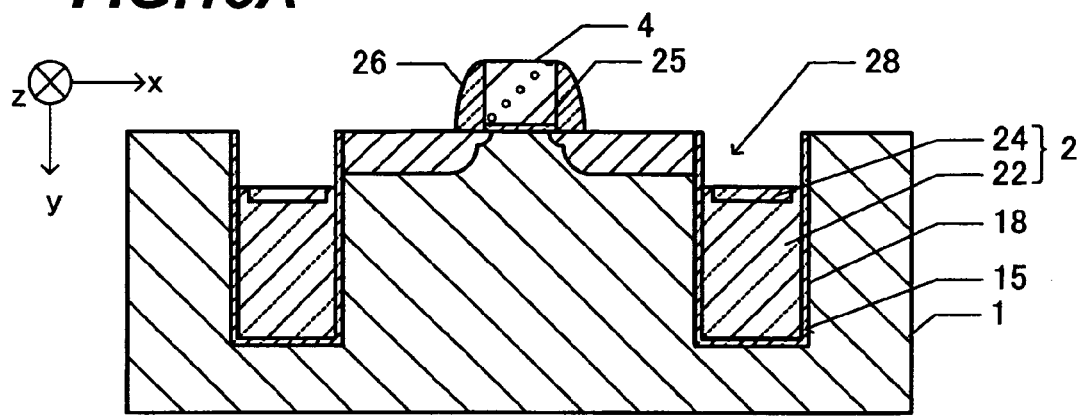
FIGS. 13A and 13B are cross sectional views of the semiconductor device of the fourth embodiment.
Figure 13B:
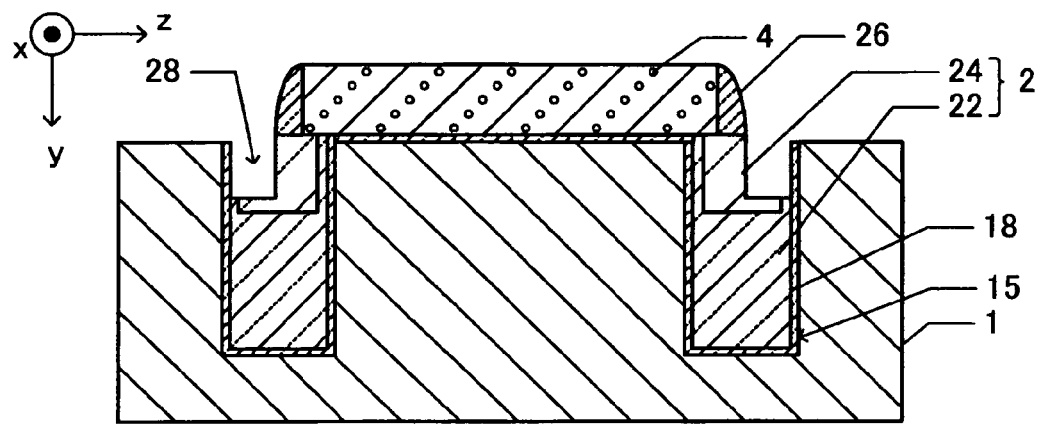

FIGS. 13A and 13B correspond to the cross sectional views taken along one-dot chain lines B3-B3 and C3-C3 shown in FIG. 3A.

In the second and third embodiments, the silicon nitride liner 20 functions as a protective film for preventing the semiconductor substrate 1 from being exposed on the inner surface of the trench 15. Meanwhile, the silicon nitride liner 20 may degrade the filling characteristics when the trench 15 is filled with silicon oxide. In the fourth embodiment, since the silicon nitride liner 20 is not formed, the filling characteristics of the lower insulating film 22 and upper insulating film 24 in the trench 15 can be improved further. In the fourth embodiment, however, since the silicon nitride liner functioning as the protective film is not formed, it is necessary to pay attention not to expose the semiconductor substrate 1 on the inner surface of the trench 15 during chemical processes for resist removal or the like.

Next, with reference to FIGS. 14A to 15B, description will be made on a semiconductor device manufacture method according to the fifth embodiment.

Figure 14A:
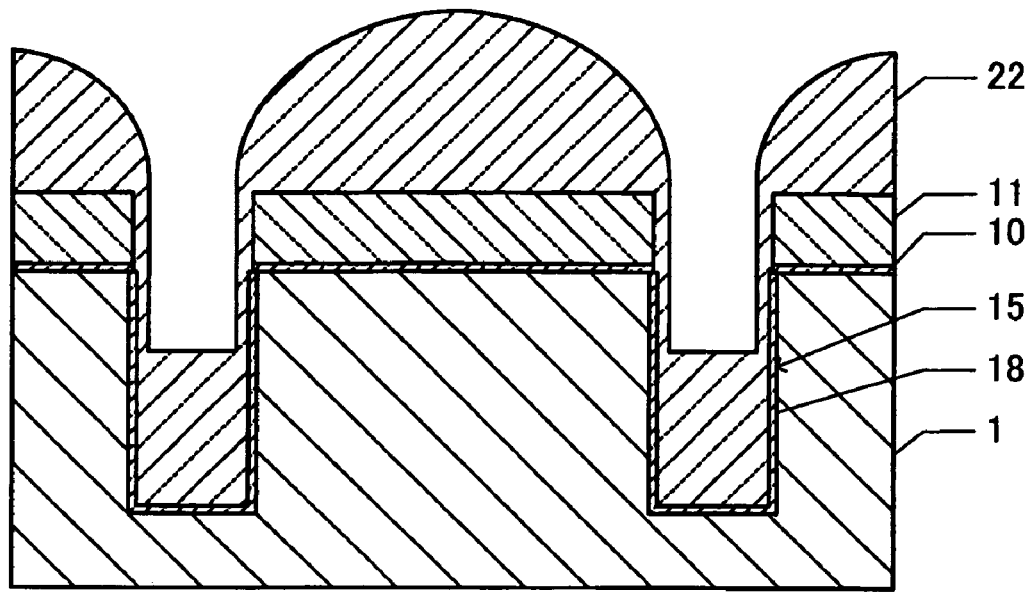
FIGS. 14A and 14B are cross sectional views illustrating a semiconductor device during manufacture in a method of manufacturing a semiconductor device according to a fifth embodiment.

As shown in FIG. 14A, a silicon oxide liner 18 is formed on the inner surface of a trench 15 by the same processes as those up to the state of the fourth embodiment shown in FIG. 12A. Thereafter, a lower insulating film 22 is deposited filling a partial region in the trench 15.

Figure 14B:
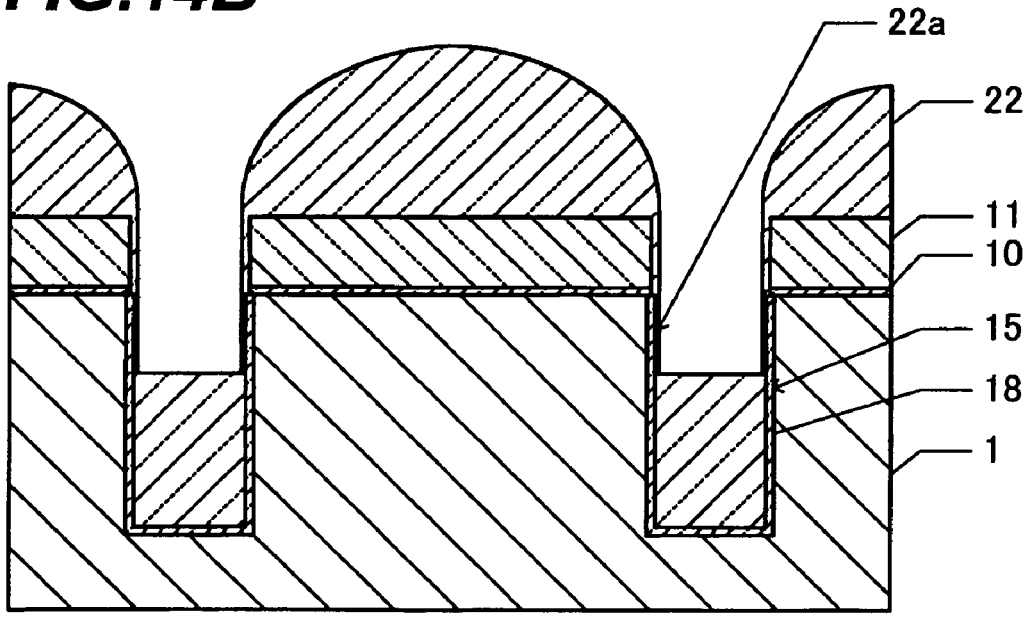

As shown in FIG. 14B, the surface layer of the lower insulating film 22 is etched with HF aqueous solution. As in the case of the third embodiment shown in FIG. 10B, a sidewall portion 22a of the lower insulating film 22 deposited on the inner surface of the trench 15 is thinned. The subsequent processes are the same as those after the state of the second embodiment shown in FIG. 8G.

Figure 15A:
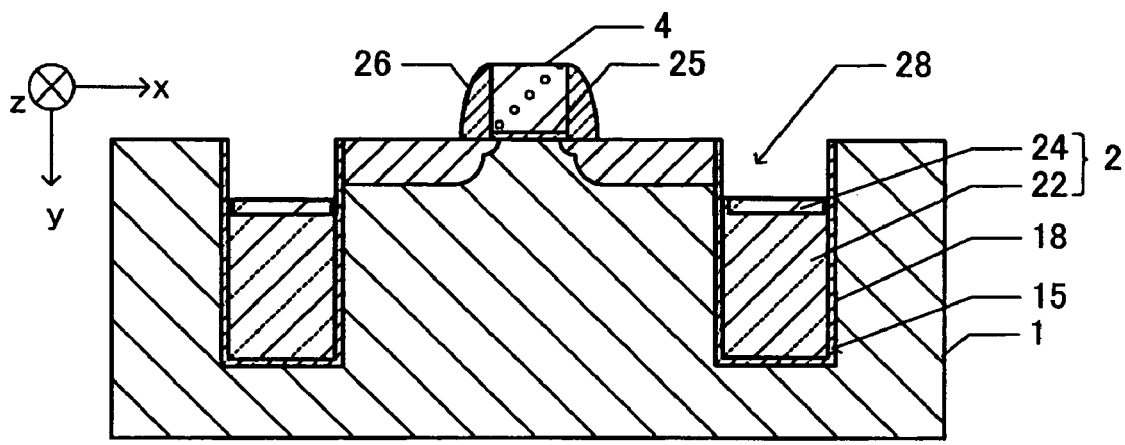
FIGS. 15A and 15B are cross sectional views of the semiconductor device of the fifth embodiment.
Figure 15B:
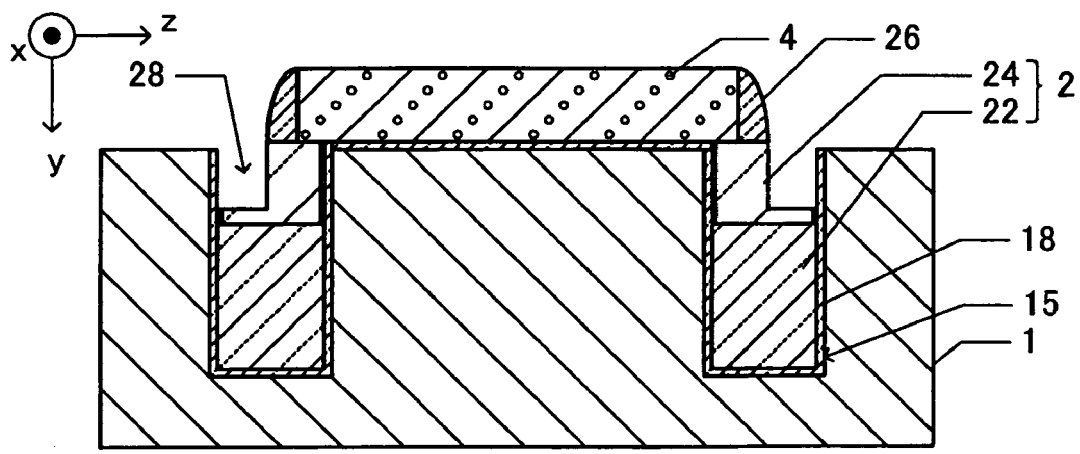

FIGS. 15A and 15B correspond to the cross sectional views taken along one-dot chain lines B3-B3 and C3-C3 shown in FIG. 3A. As in the case of the fourth embodiment shown in FIGS. 13A and 13B, since the silicon nitride liner is not disposed, the filling characteristics of the lower insulating film 22 and upper insulating film 24 in the trench 15 can be improved further. However, it is necessary to manage processes not to expose the semiconductor substrate on the inner surface of the trench 15.

Further, as in the case of the third embodiment shown in FIGS. 11A and 11B, the lower insulating film 22 disposed between the upper insulating film 24 and the side surface of the trench 15 is thinner than the lower insulating film 22 of the fourth embodiment shown in FIGS. 13A and 13B. Therefore, a larger strain can therefore be generated in the channel region.

In the above embodiments, although silicon oxide is used as the material of the lower insulating film 22 and upper insulating film 24, other insulating materials may be used. In this case, in order to make the upper insulating film 24 have therein a tensile stress, after a film having a density lower than that of the lower insulating film 22 is deposited, the film is made dense by heat treatment at a temperature higher than that used when the film is deposited.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
   a trench formed in a surface layer of a semiconductor substrate and surrounding an active region;
   a lower insulating film made of insulating material and filling a lower region of the trench; and
   an upper insulating film filling a region of the trench above the lower insulating film, the upper insulating film having therein a stress generating tensile strain in a surface layer of the active region;
   wherein the lower insulating film has therein a compressive stress.

2. The semiconductor device according to claim 1, further comprising a gate electrode intersecting with the active region and having protruded portions protruding outside a border of the active region.

3. The semiconductor device according to claim 2, wherein a thickness of the upper insulating film is 50 nm or thicker under the protruded portions of the gate electrode.

4. The semiconductor device according to claim 2, wherein an upper surface of the upper insulating film in an area not covered with the gate electrode sinks from an upper surface of the active region.

5. The semiconductor device according to claim 4, wherein the upper surface of the upper insulating film in an area not covered with the gate electrode sinks from the upper surface of the active region by 50 nm or deeper.

6. The semiconductor device according to claim 1, wherein the semiconductor substrate essentially consists of silicon, and the lower insulating film and the upper insulating film essentially consist of silicon oxide.

7. A semiconductor device comprising:
   a trench formed in a surface layer of a semiconductor substrate and surrounding an active region;
   a lower insulating film made of insulating material and filling a lower region of the trench;
   an upper insulating film filling a region of the trench above the lower insulating film, the upper insulating film having therein a stress generating tensile strain in a surface layer of the active region; and
   a gate electrode intersecting with the active region and having protruded portions protruding outside a border of the active region,
   wherein an upper surface of the upper insulating film in an area not covered with the gate electrode sinks from an upper surface of the active region by 50 nm or deeper.

* * * * *